(12) United States Patent
Wang et al.

(10) Patent No.: US 9,847,558 B1
(45) Date of Patent: Dec. 19, 2017

(54) METHODS AND APPARATUS FOR REAL-TIME CHARACTERIZATION OF BATTERIES WITH A REFERENCE ELECTRODE

(71) Applicant: HRL Laboratories, LLC, Malibu, CA (US)

(72) Inventors: Shuoqin Wang, Oak Park, CA (US); John Wang, Los Angeles, CA (US); Souren Soukiazian, Burbank, CA (US); Elena Sherman, Culver City, CA (US)

(73) Assignee: HRL Laboratories, LLC, Malibu, CA (US)

( * ) Notice: Subject to any disclaimer, the term of this patent is extended or adjusted under 35 U.S.C. 154(b) by 397 days.

(21) Appl. No.: 14/512,128

(22) Filed: Oct. 10, 2014

Related U.S. Application Data

(60) Provisional application No. 61/889,963, filed on Oct. 11, 2013.

(51) Int. Cl.
  *G01D 21/00* (2006.01)
  *G06F 17/40* (2006.01)
  (Continued)

(52) U.S. Cl.
  CPC .... *H01M 10/4285* (2013.01); *G01R 31/3624* (2013.01); *G06F 17/14* (2013.01);
  (Continued)

(58) Field of Classification Search
  None
  See application file for complete search history.

(56) References Cited

U.S. PATENT DOCUMENTS 5,633,801 A 5/1997 Bottman
6,339,334 B1 1/2002 Park
(Continued)

FOREIGN PATENT DOCUMENTS

JP 2013-129273 A * 7/2013
WO WO 2013/129273 A1 * 6/2013

OTHER PUBLICATIONS

Xiao et al., "A universal state-of-charge algorithm for batteries," 47th IEEE Design Automation Conference, Anaheim, CA, 2010.
(Continued)

*Primary Examiner* — Edward Cosimano
(74) *Attorney, Agent, or Firm* — O'Connor & Company

(57) ABSTRACT

The disclosed battery system comprises a three-electrode metal-ion battery configured with voltage meters connected between anode and cathode, between anode and a reference electrode, and between cathode and the reference electrode; a current source connecting the anode and cathode; and a programmable computer. The system is configured to control the current source to drive the battery with a current cycling profile, and to measure current signals between anode and cathode, and voltage signals derived from the voltage meters. An impulse response is then calculated for each of the anode and cathode, to dynamically estimate open-circuit potential and impedance of each of the anode and cathode. Battery aging, battery capacity fading, and other diagnostics are provided in real time. This invention can characterize each individual electrode of a battery, even when the battery is cycling away from equilibrium states, which is important for electric vehicles.

25 Claims, 18 Drawing Sheets

(51) Int. Cl.
*G06F 19/00* (2011.01)
*H01M 10/42* (2006.01)
*H01M 10/48* (2006.01)
*G06F 17/14* (2006.01)
*G06F 17/16* (2006.01)
*G01R 31/36* (2006.01)

(52) U.S. Cl.
CPC ........ *G06F 17/16* (2013.01); *H01M 10/4257* (2013.01); *H01M 10/48* (2013.01); *G01D 21/00* (2013.01); *G06F 17/40* (2013.01); *G06F 19/00* (2013.01); *H01M 2220/20* (2013.01)

(56) References Cited

U.S. PATENT DOCUMENTS

| | | | | |
|---|---|---|---|---|
| 6,969,997 | B2* | 11/2005 | Lan | G01R 31/40 324/511 |
| 7,015,701 | B2 | 3/2006 | Wiegand | |
| 7,504,835 | B2 | 3/2009 | Byington et al. | |
| 8,163,410 | B2 | 4/2012 | Fulop et al. | |
| 8,268,148 | B2 | 9/2012 | Kirchev et al. | |
| 8,421,416 | B2* | 4/2013 | Hsu | H02J 7/0072 320/132 |
| 9,207,287 | B2* | 12/2015 | Joe | H02J 7/007 |
| 9,658,293 | B2* | 5/2017 | Kimura | G01R 31/3648 |
| 9,742,042 | B2* | 8/2017 | Wang | G01R 31/3624 702/63 |
| 2004/0183543 | A1* | 9/2004 | Lan | G01R 31/40 324/511 |
| 2009/0261786 | A1* | 10/2009 | Hsu | H02J 7/0072 320/162 |
| 2011/0250478 | A1 | 10/2011 | Timmons | |
| 2013/0009604 | A1 | 1/2013 | Bhardwaj et al. | |
| 2013/0338950 | A1* | 12/2013 | Joe | H02J 7/007 702/63 |
| 2014/0343877 | A1* | 11/2014 | Kimura | G01R 31/3648 702/63 |
| 2015/0147614 | A1* | 5/2015 | Wang | G01R 31/3624 429/93 |

OTHER PUBLICATIONS

Wang et al., "Multi-parameter battery state estimator based on the adaptive and direct solution of the governing differential equations" Journal of Power Sources 196 (2011) 8735-8741.

Kiani, "Online Detection of Faulty Battery Cells in Energy Storage Systems Via Impulse Response Method" 978-1-61284-247-9/11 2011 IEEE.

Zhou and Notten, "Development of reliable lithium microreference electrodes for long-term in situ studies of lithium based battery systems," J. Electrochem. Soc. 151(12) (2004) A2173-A2179.

U.S. Appl. No. 13/646,663, filed Oct. 6, 2012, for "Methods and Apparatus for Dynamic Characterization of Electrochemical Systems" by Wang et al.

U.S. Appl. No. 13/923,354, filed Jun. 20, 2013, for "Battery With Reference Electrode for Voltage Monitoring" by Wang et al.

* cited by examiner

METHODS AND APPARATUS FOR REAL-TIME CHARACTERIZATION OF BATTERIES WITH A REFERENCE ELECTRODE

PRIORITY DATA

This patent application is a non-provisional application with priority to U.S. Provisional Patent App. No. 61/889,963 filed Oct. 11, 2013, which is hereby incorporated by reference herein.

FIELD OF THE INVENTION

The present invention generally relates to the real-time characterization of metal-ion batteries which are configured with a reference electrode.

BACKGROUND OF THE INVENTION

An electrochemical system is a system that either derives electrical energy from chemical reactions, or facilitates chemical reactions through the introduction of electrical energy. An electrochemical system generally includes a cathode, an anode, and an electrolyte, and is typically complex with multiple heterogeneous subsystems, multiple scales from nanometers to meters. Examples of these systems include batteries and fuel cells. On-line characterization of batteries or fuel cells in vehicles is difficult, due to very rough noisy environments.

On-line characterization of such electrochemical systems is desirable in many applications, which include real-time evaluation of in-flight batteries on a satellite or aviation vehicle, and dynamic diagnostics of traction batteries for electric and hybrid-electric vehicles. In many battery-powered systems, the efficiency of batteries can be greatly enhanced by intelligent management of the electrochemical energy storage system. Management is only possible with proper diagnosis of the battery states.

In many battery-powered systems such as electric vehicles and satellites, real-time characterization of battery thermodynamic potential and kinetics is desirable. The characterization is crucial for battery states estimation including the state of charge (SOC), the charge and the discharge power capabilities (state of power, SOP), and the battery state of health (SOH).

A three-electrode battery structure (i.e., a battery structure that includes a reference electrode) has one more reference electrode than a conventional battery configuration, which has only two electrodes, i.e., a cathode and an anode. Due to this additional electrode, more current and voltage information is measurable than in conventional batteries. Therefore, a three-electrode configuration is very useful for diagnostics.

Although there may be many kinds of characterization models for an electrochemical system, equivalent circuit models are most appropriate in many applications where stringent real-time requirements and limiting computing powers need to be considered. In a circuit model, major effects of thermodynamic and kinetic processes in the electrochemical system can be represented by circuit elements. For example, the electrode potential between the cathode and the anode of a system can be represented with a voltage source, the charge-transfer processes can be represented with charge-transfer resistances, the double-layer adsorption can be represented with capacitances, and mass-transfer or diffusion effects can be represented with resistances such as Warburg resistances. Therefore a circuit model is extremely useful for many on-line diagnostics of the real-time states of an electrochemical system.

Improved algorithms for characterizing electrochemical systems are needed. These algorithms, and the apparatus and systems to implement them, preferably are able to broadly accept various exciting signals, are stable and robust against noises, and are agile for real-time use.

Typical in-lab experiments on three-electrode batteries are conducted around equilibrium states; therefore, the measured anode (or cathode) potential against the reference electrode is the open-circuit potential (OCV), also called thermodynamic potential, of the anode (or cathode). However, so far there hasn't been a reliable instrumentation and method to characterize each individual electrode of the battery when the battery is cycling away from equilibrium states, under a random driving profile. In many applications, such as electric vehicles, batteries are usually driven in high rates and therefore are not around equilibrium.

What is desired is a method, system, and apparatus capable of characterizing each individual electrode of a three-electrode battery, including open-circuit potentials, when the battery is cycling in a non-equilibrium state and under a random driving profile. It would be useful to estimate each individual electrode's kinetics and its change over time, to characterize battery aging analysis with impedances. It would further be useful to estimate each individual electrode's thermodynamic potential and its change over time, to characterize battery capacity and its fade over time.

SUMMARY OF THE INVENTION

The present invention addresses the aforementioned needs in the art, as will now be summarized and then further described in detail below.

In some variations, the invention provides a method of characterizing a metal-ion battery (e.g., a lithium-ion battery) in real time, the method comprising:

(a) providing or obtaining a battery with a first electrode, a second electrode, and a reference electrode;

(b) conducting at least two of the following substeps: (b)(i) providing a first voltage meter connected between the first electrode and the second electrode; (b)(ii) providing a second voltage meter connected between the first electrode and the reference electrode; and/or (b)(iii) providing a third voltage meter connected between the second electrode and the reference electrode;

(c) driving the battery, using a current source connecting the first and second electrodes, with a current cycling profile;

(d) measuring, in real time, current signals between the first and second electrodes and at least two voltage signals derived from the first, second, and/or third voltage meters in substeps (b)(i), (b)(ii), and/or (b)(iii), respectively; and (e) dynamically characterizing open-circuit potential and impedance of each of the first and second electrodes based on the current signals and the voltage signals.

In some embodiments, all of substeps (b)(i), (b)(ii), and (b)(iii) are conducted. Optionally, in these embodiments, one of the voltage meters may be repositioned for use as another one of the voltage meters.

In some embodiments, the impulse response in step (e) is calculated using a recursive technique. For example, a recursive technique may comprise constructing an executable mathematical model of the system operable to estimate the impulse response, the mathematical model comprising an equation summing a plurality of sensed data signals including measured current passing the system at a time-certain, and measured voltage of each of the electrodes; updating the impulse response via a recursive least-squares equation based on the sensed data signals at the time-certain, and results determined at a preceding time-certain; and calculating the Fourier transform of the impulse response to obtain an impedance spectrum for each of the electrodes.

In some embodiments, the impulse response in step (e) is calculated using a matrix-based technique. For example, a the matrix-based technique may comprise the substeps of:

(e)(i) initializing a state vector, including open-circuit voltage and impulse response of a selected electrode with a finite time sequence;

(e)(ii) initializing the covariance matrix with a square matrix;

(e)(iii) sensing current and voltage signals of the selected electrode;

(e)(iv) constructing input vectors with current signals in the time sequence;

(e)(v) constructing output vectors with voltage signals in the time sequence;

(e)(vi) computing a signal difference by subtracting the inner product of the state vector and the input vector from the output vector;

(e)(vii) updating the covariance matrix;

(e)(viii) calculating a gain vector by transforming the input vector with the updated covariance matrix;

(e)(ix) updating the state vector and reading out the open-circuit voltage from the first element of the state vector; and (e)(x) updating the open-circuit voltage by repeating steps (iii)-(ix) in a next time step.

In other variations, the invention provides a battery system comprising a three-electrode metal-ion battery configured with at least two voltage meters selected from a first voltage meter connected between a first electrode and a second electrode, a second voltage meter connected between the first electrode and a reference electrode, and/or a third voltage meter connected between the second electrode and the reference electrode; a current source connecting the first and second electrodes; and a computer disposed in communication with the battery, the computer programmed using non-transitory memory with executable code for executing the steps of:

(a) controlling the current source to drive the battery with a current cycling profile;

(b) measuring current signals between the first and second electrodes, and at least two voltage signals derived from the first, second, and/or third voltage meters; and (c) calculating an impulse response of each of the first and second electrodes, from the current signals and the voltage signals, to dynamically estimate open-circuit potential and impedance of each of the first and second electrodes.

In some embodiments, the impulse response in step (c) is calculated using a recursive technique, which may (for example) include constructing an executable mathematical model of the system operable to estimate the impulse response, the mathematical model comprising an equation summing a plurality of sensed data signals including measured current passing the system at a time-certain, and measured voltage of each of the electrodes; updating the impulse response via a recursive least-squares equation based on the sensed data signals at the time-certain, and results determined at a preceding time-certain; and calculating the Fourier transform of the impulse response to obtain an impedance spectrum for each of the electrodes.

In some embodiments, the impulse response in step (c) is calculated using a matrix-based technique, which may (for example) include the substeps of:

(i) initializing a state vector, including open-circuit voltage and impulse response of a selected electrode with a finite time sequence;

(ii) initializing the covariance matrix with a square matrix;

(iii) sensing current and voltage signals of the selected electrode;

(iv) constructing input vectors with current signals in the time sequence;

(v) constructing output vectors with voltage signals in the time sequence;

(vi) computing a signal difference by subtracting the inner product of the state vector and the input vector from the output vector;

(vii) updating the covariance matrix;

(viii) calculating a gain vector by transforming the input vector with the updated covariance matrix;

(ix) updating the state vector and reading out the open-circuit voltage from the first element of the state vector; and (x) updating the open-circuit voltage by repeating steps (iii)-(ix) in a next time step.

In some embodiments, the metal-ion battery is a lithium-ion battery in which the reference electrode is not spatially between the first and second electrodes.

In the battery system of certain embodiments, the first electrode is disposed adjacent to a first current collector, wherein the first electrode supplies or accepts selected battery metal ions; the second electrode, with polarity opposite of the first electrode, is disposed adjacent to a second current collector, wherein the second electrode supplies or accepts the metal ions, and wherein the second current collector is porous and permeable to the metal ions; the reference electrode is disposed adjacent to a third current collector, wherein the reference electrode contains the metal ions; a first separator is interposed between the first electrode and the second electrode, to electronically isolate the first electrode from the second electrode; and a second separator is interposed between the second current collector and the reference electrode, to electronically isolate the second electrode from the reference electrode.

Each of the first, second, and third voltage meters is present in the battery system, in certain embodiments.

Some variations provide an apparatus for characterizing a three-electrode metal-ion battery in real time, the apparatus comprising:

at least two voltage meters selected from first, second, and third voltage meters, wherein the first voltage meter is connectable between a first electrode and a second electrode of a selected battery, the second voltage meter is connectable between the first electrode and a reference electrode of the battery, and the third voltage meter is connectable between the second electrode and the reference electrode;

a computer programmed using non-transitory memory with executable code for executing the steps of:

(a) controlling a current source to drive the battery with a current cycling profile;

(b) measuring current signals between the first and second electrodes, and at least two voltage signals derived from the first, second, and/or third voltage meters; and (c) calculating an impulse response of each of the first and second electrodes, from the current signals and the voltage signals, to dynamically estimate open-circuit potential and impedance of each of the first and second electrodes.

The apparatus may be linked in operable communication with a battery, wherein at least two of the two voltage meters are connected between electrodes. Each of the first, second, and third voltage meters is present in the apparatus, and connected between applicable electrodes, in certain embodiments. The battery may be, but is by no means limited to, a lithium-ion battery.

In some embodiments of the apparatus, the impulse response in step (c) is calculated using a recursive technique, such as a recursive technique comprising constructing an executable mathematical model of the system operable to estimate the impulse response, the mathematical model comprising an equation summing a plurality of sensed data signals including measured current passing the system at a time-certain, and measured voltage of each of the electrodes; updating the impulse response via a recursive least-squares equation based on the sensed data signals at the time-certain, and results determined at a preceding time-certain; and calculating the Fourier transform of the impulse response to obtain an impedance spectrum for each of the electrodes.

In some embodiments of the apparatus, the impulse response in step (c) is calculated using a matrix-based technique, such as a matrix-based technique comprising the substeps of:

(i) initializing a state vector, including open-circuit voltage and impulse response of a selected electrode with a finite time sequence;

(ii) initializing the covariance matrix with a square matrix;

(iii) sensing current and voltage signals of the selected electrode;

(iv) constructing input vectors with current signals in the time sequence;

(v) constructing output vectors with voltage signals in the time sequence;

(vi) computing a signal difference by subtracting the inner product of the state vector and the input vector from the output vector;

(vii) updating the covariance matrix;

(viii) calculating a gain vector by transforming the input vector with the updated covariance matrix;

(ix) updating the state vector and reading out the open-circuit voltage from the first element of the state vector; and (x) updating the open-circuit voltage by repeating steps (iii)-(ix) in a next time step.

DETAILED DESCRIPTION OF EMBODIMENTS OF THE INVENTION

Figure 1:
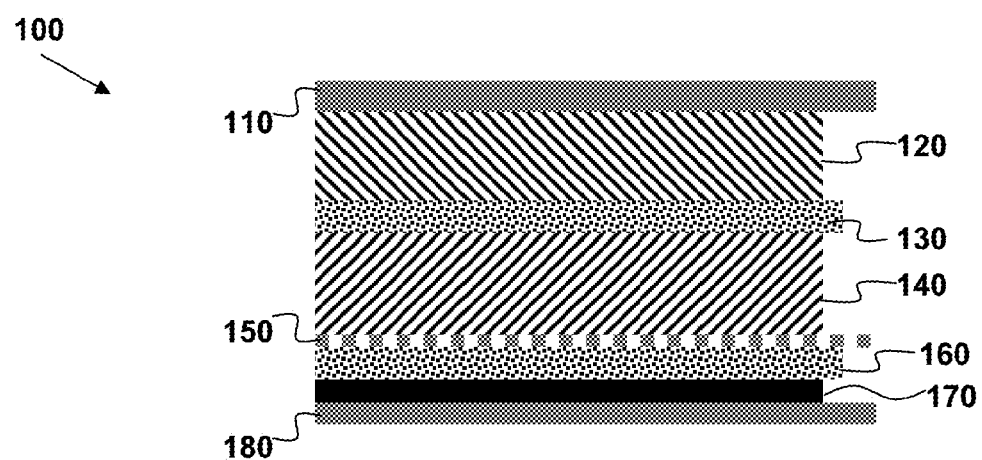
FIG. 1 is a schematic of a metal-ion battery with a reference electrode that can provide accurate monitoring of cathode and anode potentials under battery operation, in some embodiments.
Figure 1:
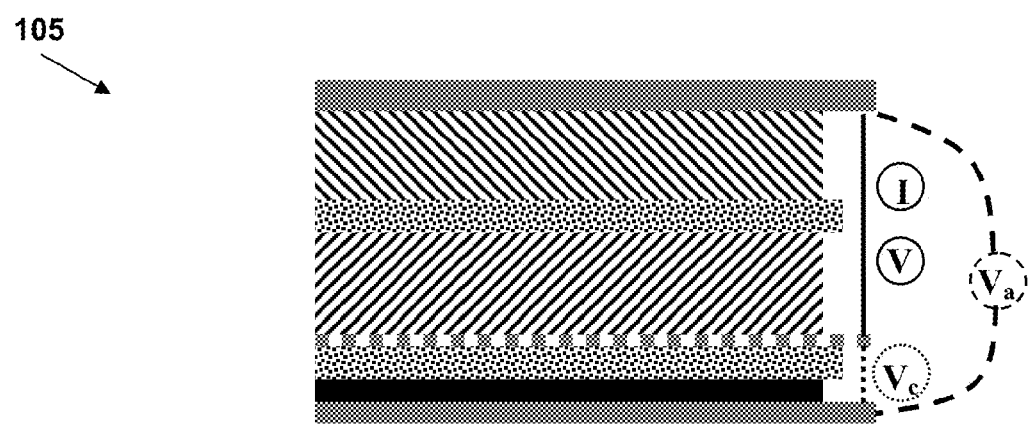

The methods, apparatus, and systems of the present invention will be described in detail by reference to various non-limiting embodiments and figures.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs. As intended herein, "receiving" shall be broadly construed as including "providing," "sensing" (e.g., using a sensor attached to a computer), "calculating" (e.g., using executable code in a computer), and so on.

Unless otherwise indicated, all numbers expressing parameters, conditions, results, and so forth used in the specification and claims are to be understood as being modified in all instances by the term "about." Accordingly, unless indicated to the contrary, the numbers set forth in the following specification and attached claims are approximations that may vary depending upon specific algorithms and calculations.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Embodiments of the present invention will now be described in detail, including reference to the accompanying figures. The figures provide representative illustration of the invention and are not limiting in their content. It will be understood by one of ordinary skill in the art that the scope of the invention extends beyond the specific embodiments depicted. In particular, for example, the invention is by no means limited to lithium-ion batteries.

Some variations of the invention provide circuit connections in systems and apparatus, and associated methods, that can characterize a three-electrode battery in real time. The proposed circuit connection enables measurement of both anode and cathode potential, sampling them concurrently without interference. The physical parameters characterized include anode open circuit voltage, cathode open circuit voltage, anode kinetic impedance, and cathode kinetic impedance.

In order to realize real-time characterization of a three-electrode battery, an impulse response algorithm is applied to each individual electrode. The algorithm contains no presumptions of battery kinetic behaviors, and is readable for any three-electrode battery configuration. A recursive regression technique in time-domain (as described in detail below) facilitates robustness against noises and agility for real-time use. Impulse-response-based algorithms provide a time-domain regression technique that is capable of real-time characterization of an electrochemical system or components thereof, i.e., individual electrodes.

Some variations of this invention utilize an impulse-response-based algorithm for on-line characterization of a given electrode and a three-electrode battery. An algorithm as provided herein may utilize measured current (I) and/or voltage (V) signals to directly extract thermodynamic and kinetic information associated with the electrochemical system, dynamically (in real time). Impulse-response-based algorithms can provide high-speed characterization of an electrochemical system with improved accuracy. The algorithms are robust and suitable for real environment applications under various operating conditions.

The algorithms work in the time domain without relying on frequency-domain transformations. Therefore, these methods are more aligned for real-time applications. In addition, the disclosed impulse-response-based algorithms provide broader capabilities in characterizing an electrochemical system by prescribing an impulse-response function. Circuit models employing conventional circuit elements can have difficulty describing some kinetic processes. In particular, the methods herein explicitly account for time-domain diffusion phenomena.

Embodiments of the invention can improve battery diagnosis and battery management systems. Examples include improving battery state-of-charge (SOC) monitoring, enhancing battery safety, monitoring battery aging, and extending battery life. Battery states include, but are not limited to, state-of-health, state-of-charge, state-of-power, high-frequency resistance, charge-transfer resistance, and double-layer capacitance. State-of-health is a figure of merit of the condition of a battery (or a cell, or a battery pack), compared to its ideal conditions. State-of-charge is an indication of how much useful energy remains in the battery. State-of-power characterizes the charge and discharge power capabilities of the battery. High-frequency resistance, charge-transfer resistance, and double-layer capacitance characterize the actual kinetic processes that take place in the battery, including both electrochemical reactions as well as mass transport and diffusion processes.

In some variations, the invention provides a method of characterizing a metal-ion battery (e.g., a lithium-ion battery) in real time, the method comprising:

(a) providing or obtaining a battery with a first electrode, a second electrode, and a reference electrode;

(b) conducting at least two of the following substeps: (b)(i) providing a first voltage meter connected between the first electrode and the second electrode; (b)(ii) providing a second voltage meter connected between the first electrode and the reference electrode; and/or (b)(iii) providing a third voltage meter connected between the second electrode and the reference electrode;

(c) driving the battery, using a current source connecting the first and second electrodes, with a current cycling profile;

(d) measuring, in real time, current signals between the first and second electrodes and at least two voltage signals derived from the first, second, and/or third voltage meters in substeps (b)(i), (b)(ii), and/or (b)(iii), respectively; and (e) dynamically characterizing open-circuit potential and impedance of each of the first and second electrodes based on the current signals and the voltage signals.

In some embodiments, all of substeps (b)(i), (b)(ii), and (b)(iii) are conducted. Optionally, in these embodiments, one of the voltage meters may be repositioned for use as another one of the voltage meters.

In some embodiments, the impulse response in step (e) is calculated using a recursive technique. For example, a recursive technique may comprise constructing an executable mathematical model of the system operable to estimate the impulse response, the mathematical model comprising an equation summing a plurality of sensed data signals including measured current passing the system at a time-certain, and measured voltage of each of the electrodes; updating the impulse response via a recursive least-squares equation based on the sensed data signals at the time-certain, and results determined at a preceding time-certain; and calculating the Fourier transform of the impulse response to obtain an impedance spectrum for each of the electrodes.

In some embodiments, the impulse response in step (e) is calculated using a matrix-based technique. For example, a the matrix-based technique may comprise the substeps of:

(e)(i) initializing a state vector, including open-circuit voltage and impulse response of a selected electrode with a finite time sequence;

(e)(ii) initializing the covariance matrix with a square matrix;

(e)(iii) sensing current and voltage signals of the selected electrode;

(e)(iv) constructing input vectors with current signals in the time sequence;

(e)(v) constructing output vectors with voltage signals in the time sequence;

(e)(vi) computing a signal difference by subtracting the inner product of the state vector and the input vector from the output vector;

(e)(vii) updating the covariance matrix;

(e)(viii) calculating a gain vector by transforming the input vector with the updated covariance matrix;

(e)(ix) updating the state vector and reading out the open-circuit voltage from the first element of the state vector; and (e)(x) updating the open-circuit voltage by repeating steps (iii)-(ix) in a next time step.

A total voltage response of a circuit can be formulated as the superposition of the zero-state response (ZSR) and the zero-input response (ZIR). The ZSR results only from the external inputs of driving currents of the circuit; the ZIR results only from the initial state of the circuit and not from any external drive. For an electrochemical system such as a battery, the ZIR is the open-circuit voltage (OCV or $V_{oc}$) source if the battery has been open circuit for a sufficient time, ignoring self-discharge, to reach an equilibrium state. The ZSR can be calculated as the convolution of the driving currents with an impulse response characterizing the system.

The equation of a voltage response of an electrochemical system such as a battery can thus be written as:

$$V(t) = OCV(t) + \int_0^\infty I(t-\tau)H(\tau)d\tau \quad \text{(EQ. 1)}$$

In EQ. 1, V(t) and I(t) are the measured voltage and current values as a function of time. H(t) is the impulse response. In defining the integration range from 0 to ∞, we have complied with the causality that the real-time response is only caused by the inputs at the current time and the time before.

It is assumed that the impulse response converges to zero after finite time $T_o$, i.e., H(t)=0, as t>$T_o$. It is a reasonable approximation for many electrochemical systems, and EQ. 1 is modified as:

$$V(t) = OCV(t) + \int_0^{T_o} I(t-\tau)H(\tau)d\tau \quad \text{(EQ. 2)}$$

Further modification is made by differentiating the two sides of the EQ. 2 with time. Differentiating data is equivalent to high-pass filtering for removing static noises which, as the present inventors have discovered, can improve the stability of the algorithm. Moreover, we assume $$\frac{dV(t)}{dt} \gg \frac{dOCV(t)}{dt},$$

which is reasonable as long as there are finite current inputs. The result is EQ. 3:

$$\frac{dV(t)}{dt} = \int_0^{T_o} \frac{dI(t-\tau)}{dt} H(\tau)dt \quad \text{(EQ. 3)}$$

EQ. 3 is the main equation relied upon to solve the impulse response H(t), in some embodiments. However, EQ. 3 is not an explicit formula for H(t).

Figure 3:
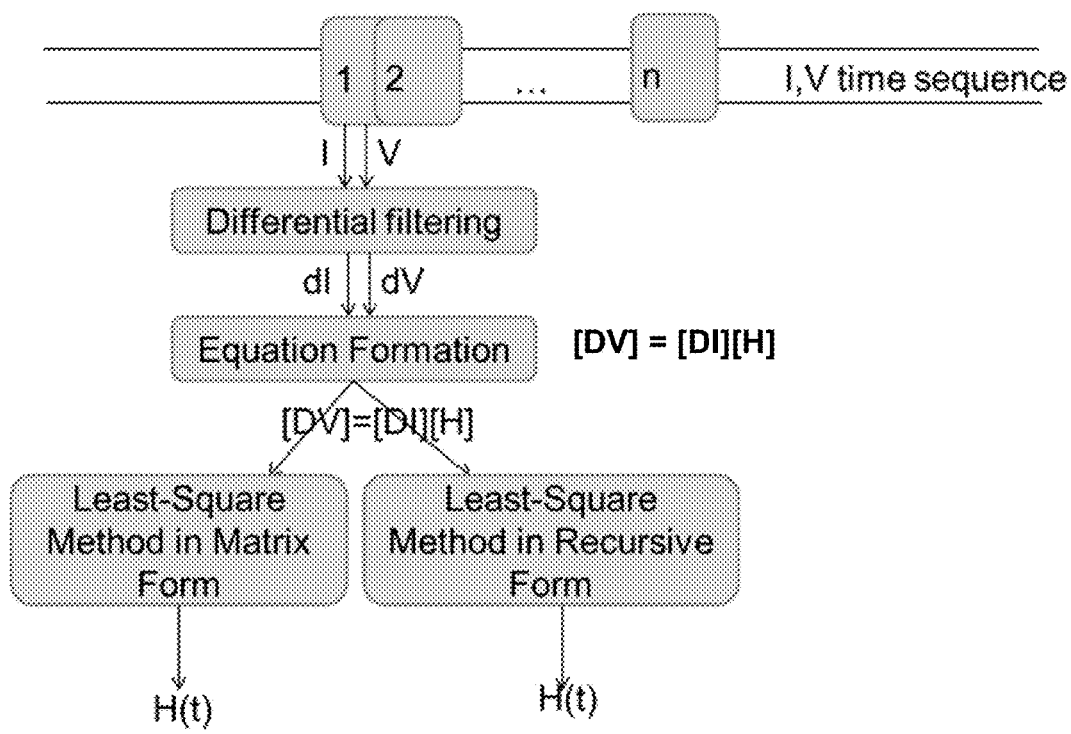
FIG. 3 is an illustration of an exemplary technique to calculate the impulse response, in some embodiments.

The desired impulse response H(t) needs to be obtained by deconvolution from EQ. 3. A workflow of solving H(t) is illustrated in FIG. 3, which depicts an exemplary method.

EQ. 3 can be digitized, since evaluation is carried out at the sampling instants with T as the sampling interval. The digitized formula becomes EQ. 4:

$$[DV] = [DI] \cdot [H] \quad \text{(EQ. 4)}$$

with $$[DV] = [V_{N+1} - V_N, V_{N+2} - V_{N+1}, \ldots, V_{N+M} - V_{N+M-1}]^T$$

$$[DI] = \begin{bmatrix} I_{N+1} - I_N & I_N - I_{N-1} & \ldots & I_2 - I_1 \\ I_{N+2} - I_{N+1} & I_{N+1} - I_N & \ldots & I_3 - I_2 \\ \ldots & \ldots & \ldots & \ldots \\ I_{N+M} - I_{N+M-1} & I_{N+M-1} - I_{N+M-2} & \ldots & I_{M+1} - I_M \end{bmatrix}$$

$$[H] = [H_0, H_1, \ldots, H_{N-1}]^T.$$

The subscripts in the EQ. 4 represent the sampling coefficients. In some embodiments, N can be chosen so that N≈$T_0$/T. H(t) is evaluated at t=0, T, 2T, ..., (N−1)T and it is assumed that H(t)=0 for t≥$T_0$=NT. The sum of N and M defines the size of the temporal window, Δt=(N+M)T, in which the sampled V(t) and I(t) will be used to fill in the matrices of [DV] and [DI]. In these embodiments the sizes of the matrices [DV], [DI], and [H] are M×1, M×N, and N×1, respectively, which means that M≥N is the necessary condition for the valid solution of H(t).

With respect to EQS. 3 and 4, there are essentially always noises in the V(t) and I(t) data which are not explicitly expressed. In order to improve the stability of the algorithm against such noises, a least-squares method may be utilized to solve [H]. In the form of matrices, the solution is given by EQ. 5:

$$[H] = ([DI]^T [DI])^{-1} [DI]^T [DV] \quad \text{(EQ. 5)}$$

A valid solution to EQ. 5 for [H] can be acquired as long as the matrix product $[G]=[DI]^T[DT]$ is nonsingular. The rank of [G] provides an estimate of the number of linearly independent rows or columns of [G], at given points in time. There are a number of ways to compute the rank. In some embodiments, singular value decomposition is employed.

In some embodiments, recursive algorithms are utilized wherein all information utilized stems from previous time-step calculations and measurements at the present time-steps. Optionally, a moving-window technique may be employed to update the algorithm recursively. The sizes of the impulse response and the window can be adjusted to accommodate the bandwidth of the kinetics of the selected battery.

There are several methods to dictate the adjustment of the size of the sampling window. One method is to adjust the size based on the knowledge of the thermodynamics and kinetics of the electrochemical system. If the system has a more sluggish kinetic response, the window may be increased, and vice versa. The response time is different for different electrochemical systems. Also the response time is generally different for a given system at different times.

Another method to dictate the adjustment of the size of the sampling window is based on mathematics. The size of the window can be increased at first, and the result of the impulse response H(t) can be used to compare with the H(t) with the original window size. If H(t) changes significantly, the sampling window size may be increased. If H(t) does not change significantly, the size of the window is deemed to be wide enough.

Due to the limitations of computer storage and constraints of embedded controllers, recursive algorithms may be preferred, in some embodiments. Using recursive algorithms, all information that is utilized at a given time-step derives from previous time-step calculations along with measurements at the present time-step. The following equations apply to recursive algorithms.

From EQ. 5, the recursive form can be derived as EQ. 6:

$$\sum_{i=0}^{N-1} H_i \sum_{j=0}^{M-1} DI_{jl} DI_{ji} = \sum_{j=0}^{M-1} DI_{jl} DV_j \qquad \text{(EQ. 6)}$$

where $DI_{ij} = I_{N+i-j+1} - I_{N+i-j}$, $DV_i = V_{N+i+1} - V_{N+i}$.

Each element of the impulse response [H] can be expressed as $$H_l = \frac{X_l - \sum_{i=0,i\neq l}^{N} H_i Y_{il}}{Z_l} = \frac{\sum_{j=0}^{M-1} DI_{jl} DV_j - \sum_{i=0,i\neq l}^{N} H_i \sum_{j=0}^{M-1} DI_{jl} DI_{ji}}{\sum_{j=0}^{M-1} DI_{jl}^2} \qquad \text{(EQ. 7)}$$

The $X_i$, $Y_{ij}$, $Z_i$ with i, j=0, 1, . . . , N are updated with the following recursive equations:

For i=1, 2, 3, . . . , N−1, $X_i^t = X_{i-1}^{t-1}$ $Y_{iL}^t = Y_{i-1,L-1}^{t-1}$ $Y_{Li}^t = Y_{iL}^t, L=1,2, \ldots N$ $Z_i^t = Z_{i-1}^{t-1}$ For i=0, $X_0^t = X_0^{t-1} + (I_{N+M+1} - I_{N+M})(V_{N+M+1} - V_{N+M}) - (I_{N+1} - I_N)(V_{N+1} - V_N)$ $Y_{0L}^t = Y_{0L}^{t-1} + (I_{N+M+1} - I_{N+M})(I_{N+M-L} - V_{N+M-L-1}) - (I_{N+1} - I_N)(V_{N-L+1} - V_{N-L})$, $Y_{L0}^t = Y_{0L}^t$ $L = 1,2, \ldots N$ $Z_0^t = Z_0^{t-1} + (I_{N+M+1} - I_{N+M})^2 - (I_{N+1} - I_N)^2$ In calculating each $H_i$ (i=0, 1, 2, . . . , N−1) at the current time with EQ. 7, the most-updated H elements are used on the right-hand side of the equation.

The Fourier transform of the impulse response H(t) represents the impedance spectroscopy. "Impedance spectroscopy" generally refers to signal measurement of the linear electrical response and subsequent analysis of the response to yield useful information about the physicochemical properties of a system. From the impedance spectroscopy, state-of-health, state-of-charge, and state-of-power may be monitored.

Specifically, the impedance at high frequency may be used as an indicator for state-of-health. The reason is that most the impedance of typical batteries increases with age. This high-frequency impedance can be directly read out from the spectrum. State-of-charge may be deduced with the open circuit voltage via a voltage-state-of-charge look-up table. The open circuit voltage is a thermodynamic parameter which can be derived if the kinetic response of the system is known. State-of-power is the current response to the maximum/minimum voltage input. Therefore, it can be calculated with the convolution of the voltage and the impulse response.

Some variations can be understood with reference to FIG. 1, which is a schematic of a metal-ion battery with a reference electrode that can provide accurate monitoring of cathode and anode potentials under battery operation. The configuration includes a negative electrode material on metal foil, a positive electrode material on metal mesh, and a metal reference electrode on metal foil. Each electrode is electronically isolated by separators. In some embodiments of FIG. 1, for example, the battery structure 100 is in a layered configuration. A cathode 140 coated on a porous aluminum (Al) mesh (porous) current collector 150 faces an anode 120 coated on a copper (Cu) current collector 110 separated by a separator layer 130. The porous current collector 150 enables ion communication through the cathode. A reference electrode 170 (for example, lithium on copper foil 180) is disposed adjacent to the cathode 140 with Al mesh current collector 150. The reference electrode 170 is electronically isolated from the other electrodes by a separator layer 160. The anode 120 and cathode 140 may be switched, if desired.

The battery structure 105 of FIG. 1 (lower drawing) depicts circuit connections that may be employed. A current source/meter (labeled with a circled I) and a voltage meter (labeled with a circled V) are connected between the anode's Cu current collector 110 and the cathode's Al current collector 150. Another voltage meter (labeled $V_a$ with dashed lines) is connected between the anode's Cu current collector 110 and the reference electrode's Cu foil current collector 180. Another voltage meter (labeled $V_c$ with dotted lines) is connected between the cathode's Al current collector 150 and the reference electrode's Cu foil current collector 180. The battery is driven with a current I cycling profile, and measurement is made in real time of the current I and voltage V between anode and cathode, as well as the anode potential $V_a$ referring to the reference electrode and/or the cathode potential $V_c$ referring to the reference electrode. It is noted that one of the voltage meters in FIG. 1 is redundant but may be employed to verify the data. That is, only two of the voltage meters (V, $V_a$, $V_c$) are necessary.

Figure 2:
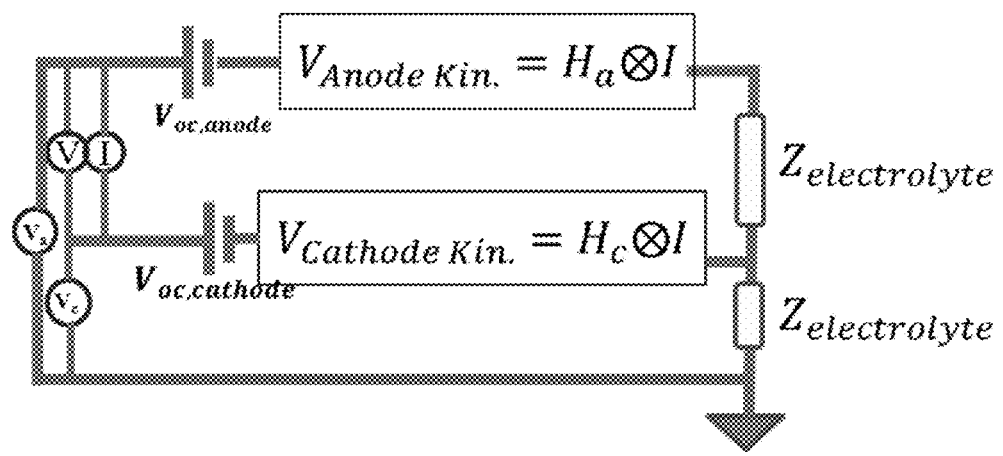
FIG. 2 is an illustration of an impulse-response model that may be employed for a three-electrode configuration, in some embodiments.

FIG. 2 illustrates an impulse-response model that may be employed for the three-electrode configuration of FIG. 1, in some embodiments. As shown in FIG. 2, each electrode's total voltage between its current collector (coil) and its liquid phase equals the sum of its open circuit voltage and its kinetic voltage. There will be a small voltage drop between the liquid phase and the reference electrode due to the impedance symbolized as $Z_{electrolyte}$. However, it can be assumed that $Z_{electrolyte}=0$ because it is several orders smaller than the reference electrode's impedance.

Each electrode's total voltage can therefore be estimated as its potential difference from the reference electrode. Consequently, we obtain the following two equations that govern the three-electrode battery voltage response to its current input I:

$V_{anode} = V_{oc,anode} + H_a(x) I$ (EQ. 8)

$V_{cathode} = V_{oc,cathode} + H_c(x) I$ (EQ. 9)

EQ. 8 gives the anode potential as the sum of its thermodynamic potential and kinetic potential, while EQ. 9 gives the cathode potential as the sum of its thermodynamic potential and kinetic potential. The sum of EQS. 8 and 9 leads to the governing equation for a conventional two-electrode cell, which is:

$$V = V_{oc} + H_R(x)I \quad \text{(EQ. 10)}$$

In EQ. 10, we have $$V_{oc} = -V_{oc,anode} + V_{oc,cathode} \quad \text{(EQ. 11)}$$

and $$H_R = H_a + H_c \quad \text{(EQ. 12)}$$

where $H_R$, $H_a$, and $H_c$ are the impulse responses of the total cell, anode, and cathode, respectively.

Since $V_{anode}$, $V_{cathode}$, V, and I are measured in real time, $V_{oc,anode}$, $V_{oc,cathode}$, $H_c$, and $H_a$ can be regressed out also in real time based on recursive or matrix-based algorithms described above (EQS. 1-7), or another suitable algorithm. EQS. 10-12 may then be used for verification of the electrode characteristics. Note that the impulse response of each electrode can be calculated using the same or different techniques, although it is preferred to employ a common technique for consistency.

Some embodiments utilize an algorithm as described in U.S. patent application Ser. No. 13/646,663, filed Oct. 6, 2012, for "METHODS AND APPARATUS FOR DYNAMIC CHARACTERIZATION OF ELECTROCHEMICAL SYSTEMS" by Wang et al., now U.S. Pat. No. 9,417,290, issued Aug. 16, 2016, which is hereby incorporated by reference herein.

In other variations, the invention provides a battery system comprising a three-electrode metal-ion battery configured with at least two voltage meters selected from a first voltage meter connected between a first electrode and a second electrode, a second voltage meter connected between the first electrode and a reference electrode, and/or a third voltage meter connected between the second electrode and the reference electrode; a current source connecting the first and second electrodes; and a computer disposed in communication with the battery, the computer programmed using non-transitory memory with executable code for executing the steps of:

(a) controlling the current source to drive the battery with a current cycling profile;

(b) measuring current signals between the first and second electrodes, and at least two voltage signals derived from the first, second, and/or third voltage meters; and (c) calculating an impulse response of each of the first and second electrodes, from the current signals and the voltage signals, to dynamically estimate open-circuit potential and impedance of each of the first and second electrodes.

In some embodiments, the impulse response in step (c) is calculated using a recursive technique, which may (for example) include constructing an executable mathematical model of the system operable to estimate the impulse response, the mathematical model comprising an equation summing a plurality of sensed data signals including measured current passing the system at a time-certain, and measured voltage of each of the electrodes; updating the impulse response via a recursive least-squares equation based on the sensed data signals at the time-certain, and results determined at a preceding time-certain; and calculating the Fourier transform of the impulse response to obtain an impedance spectrum for each of the electrodes.

In some embodiments, the impulse response in step (c) is calculated using a matrix-based technique, which may (for example) include the substeps of:

(i) initializing a state vector, including open-circuit voltage and impulse response of a selected electrode with a finite time sequence;

(ii) initializing the covariance matrix with a square matrix;

(iii) sensing current and voltage signals of the selected electrode;

(iv) constructing input vectors with current signals in the time sequence;

(v) constructing output vectors with voltage signals in the time sequence;

(vi) computing a signal difference by subtracting the inner product of the state vector and the input vector from the output vector;

(vii) updating the covariance matrix;

(viii) calculating a gain vector by transforming the input vector with the updated covariance matrix;

(ix) updating the state vector and reading out the open-circuit voltage from the first element of the state vector; and (x) updating the open-circuit voltage by repeating steps (iii)-(ix) in a next time step.

In some embodiments, the metal-ion battery is a lithium-ion battery in which the reference electrode is not spatially between the first and second electrodes.

In the battery system of certain embodiments, the first electrode is disposed adjacent to a first current collector, wherein the first electrode supplies or accepts selected battery metal ions; the second electrode, with polarity opposite of the first electrode, is disposed adjacent to a second current collector, wherein the second electrode supplies or accepts the metal ions, and wherein the second current collector is porous and permeable to the metal ions; the reference electrode is disposed adjacent to a third current collector, wherein the reference electrode contains the metal ions; a first separator is interposed between the first electrode and the second electrode, to electronically isolate the first electrode from the second electrode; and a second separator is interposed between the second current collector and the reference electrode, to electronically isolate the second electrode from the reference electrode.

Each of the first, second, and third voltage meters is present in the battery system, in certain embodiments. An external reference circuit may be electrically connected to a monitor to display or record voltage of each electrode.

Some embodiments of the invention utilize battery configurations that enable accurate in situ monitoring of the potentials of the cathode (positive electrode) and anode (negative electrode) under actual operation of a lithium-ion battery. In such configurations, a third electrode is incorporated as a reference electrode. Porous current collectors allow the communication of ions through the backside (away from the direct ion paths between the cathode and anode) where a reference electrode is inserted. The reference electrode is electronically isolated using one or more separators.

The primary functional components of a typical lithium-ion battery are the anode, cathode, and electrolyte, in which a lithium ion moves between the anode and cathode in the electrolyte. A separator is used to separate cathode and anode to prevent electron shortage. Current collectors, normally metal, are used to collect electrons from both cathode and anode. The lithium ion moves from the anode to the cathode during discharge and from the cathode to the anode when charging.

Both the anode and cathode are materials into which and from which lithium can migrate. The process of lithium moving into the anode or cathode is referred to as insertion (or intercalation), and the reverse process, in which lithium moves out of the anode or cathode is referred to as extraction (or deintercalation).

Battery capacity is primarily determined by the amount of active lithium traveling between the anode and the cathode. When the battery is charged for the first time, lithium leaves the cathode and enters the anode. After all removable lithium leaves the cathode, only part of that lithium is active in the anode because some lithium will typically be lost to form a solid-state electrolyte interface on the anode surface. During subsequent battery cycles, the amount of active lithium will be smaller than the storage capacity of both the cathode and the anode. Consequently, lithium battery capacity is usually equal to the amount of active lithium. Corrosion of this active lithium during the life of the battery leads directly to capacity loss.

The cathode and anode should be electronically separated by a separator, but ionically connected with electrolyte. Reference electrodes with large surface areas may be utilized, to minimize polarization resistance. In addition, the reference electrode may be disposed very close to the target electrodes, to minimize IR drop while avoiding the shielding effect. An IR drop is caused when a reference electrode is too far away from the target electrodes. The shielding effect is caused when a reference electrode blocks the current pathways between the positive and negative electrodes.

While the addition of the reference electrode will slightly reduce the overall cell energy density, this reduction will be compensated for by the benefits gain from dramatically improved battery health monitoring and battery safety.

Conventional reference electrodes suffer from two fundamental issues that compete with each other: (i) the reference electrode needs to be as close as possible to the target electrode to minimize the IR drop; (ii) conversely, the reference electrode needs to far enough from the target electrode to avoid a shielding effect that distorts the electrical current path between the cathode and anode.

The conventional wisdom is to use very thin wires (e.g., submicron in diameter) to reduce the shielding effect while getting closer to the target electrode. However, thin-wire reference electrodes often are associated with large polarization resistance. To avoid the distortion of the current pathways, some known designs place the reference electrode on the edge or the cross section of the battery electrodes, outside of the current path between the cathode and anode; however, the voltage readings may not be accurate due to edge effects and voltage interference.

The aforementioned limitations can be mitigated by a different battery configuration, such as that illustrated in FIG. 1. FIG. 1 is a schematic of a lithium-ion battery with a reference electrode that can provide accurate monitoring of cathode and anode potentials and impedance under battery operation, according to the present disclosure. The configuration includes a negative electrode material on copper foil, a positive electrode material on aluminum mesh, and a lithium metal reference electrode on copper foil. Each electrode is electronically isolated by separators. When soaked in an organic electrolyte, the structure of FIG. 1 enables direct ion communication between the reference electrode and the cathode and anode, without blocking the current pathways of the battery. Note that the positions of the anode and cathode may be switched in alternative embodiments.

During normal battery operation, current is flowing between the cathode and anode. The voltage meters are used to monitor potentials as described above. With reference to FIG. 1, the voltage between current collectors 110 and 150 is the normal battery voltage. The voltage between current collectors 110 and 180 is the anode voltage. The voltage between current collectors 150 and 180 is the cathode voltage. Subtraction of the cathode voltage from the anode voltage gives the battery voltage.

In addition, a very small current may optionally be applied between the cathode and the reference electrode and/or between the anode and the reference electrode, during battery operation, in certain embodiments. Such reference current is preferably less than about $10^{-6}$ amp, such as about $10^{-7}$ amp, $10^{-8}$ amp, $10^{-9}$ amp, or less.

The reference electrode may be rather large in terms of its "projected area," which means the geometric area of the surface as projected toward the anode or cathode. The reference electrode may have a reference-electrode projected area that is at least about 10%, 20%, 30%, 40%, 50%, 60%, 70%, 80%, 90%, 100% or more of the projected area of the anode and/or the cathode.

The surface area of a reference electrode may vary widely, such as from about 1 mm$^2$ to about 10 cm$^2$ or more. In some embodiments, the area of the reference electrode is as large as the actual size of the working electrode, such as its projection area.

The porous current collector 150 may be characterized by an average pore size from about 1 nm to about 10 µm, such as about 2 nm, 3 nm, 5 nm, 8 nm, 10 nm, 15 nm, 20 nm, 30 nm, 50 nm, 75 nm, 100 nm, 200 nm, 300 nm, 400 nm, 500 nm, 600 nm, 700 nm, 800 nm, 900 nm, 1 µm, 2 µm, 3 µm, 4 µm, 5 µm, 6 µm, 7 µm, 8 µm, or 9 µm.

The porous current collector 150 may be characterized by an average pore-to-surface ratio (in two dimensions) or porosity (in three dimensions) from about 0.1% to about 99.9%, such as about 0.5%, 1%, 2%, 3%, 4%, 5%, 10%, 15%, 20%, 25%, 30%, 35%, 40%, 45%, 50%, 55%, 60%, 65%, 70%, 75%, 80%, 85%, 90%, 95%, or 99%. In some embodiments, the average pore-to-surface ratio or porosity is at least 1%, 5%, 10%, 15%, or 20%.

The metal ions may be selected from the group consisting of lithium ions, sodium ions, potassium ions, magnesium ions, calcium ions, and combinations thereof.

In preferred embodiments, the metal ions are lithium ions. The anode 120 material must be capable of incorporating lithium ions during battery charging, and then releasing the lithium ions during battery discharge. Exemplary anode 120 materials suitable for the present invention include, but are not limited to, carbon materials such as graphite, coke, soft carbons, and hard carbons; and metals such as Si, Al, Sn, or alloys thereof. Other exemplary anode 120 materials include titanium oxides, germanium, copper/tin, and lithium compounds containing metal oxides, such as oxides of W, Fe, and Co. Anodes 120 can also include fillers and binders. The anode 120 material preferably exhibits long cycle life and calendar life, and does not experience significant resistance increase throughout the life of the battery.

Preferably, the anode 120 material consists essentially of graphitic carbon or another electron-conducting carbon. Some examples of electron-conducting carbon include natural graphites, such as flaky graphite, plate-like graphite, and other types of graphite; high-temperature sintered carbon products obtained, for example, from petroleum coke, coal coke, celluloses, saccharides, and mesophase pitch; artificial graphites, including pyrolytic graphite; carbon blacks, such as acetylene black, furnace black, Ketjen black, channel black, lamp black, and thermal black; asphalt pitch, coal tar, active carbon, mesophase pitch, and polyacetylenes.

The cathode 140 material must be capable of supplying lithium ions during battery charging, and then incorporating the lithium ions during battery discharge. The cathode 140 material can be, for example, a lithium metal oxide, phosphate, or silicate. Exemplary cathode materials suitable for the present invention include, but are not limited to, $LiMO_2$ (M=Co, Ni, Mn, or combinations thereof); $LiM_2O_4$ (M=Mn, Ti, or combinations thereof); $LiMPO_4$ (M=Fe, Mn, Co, or combinations thereof); and $LiM_xM'_{2-x}O_4$ (M, M'=Mn or Ni). The cathode 140 material preferably exhibits long cycle life and calendar life, and does not experience significant resistance increase throughout the life of the battery.

The cathode 140 may further include one or more conductive fillers to provide enhanced electronic conductivity. Examples of conductive fillers include, but are not limited to, conductive carbons, graphites, activated carbon fibers, non-activated carbon nanofibers, metal flakes, metal powders, metal fibers, carbon fabrics, metal mesh, and electrically conductive polymers. The cathode 140 may also further comprise other additives such as, for example, alumina, silica, and transition-metal chalcogenides.

The cathode 140 may also include a binder. The choice of binder material may vary widely so long as it is inert with respect to the other materials in the cathode. Useful binders are materials, usually polymeric, that allow for ease of processing of battery electrode composites and are generally known to those skilled in the art of electrode fabrication. Examples of useful binders include, but are not limited to, polytetrafluoroethylenes, polyvinylidene fluorides, ethylene-propylene-diene rubbers, polyethylene oxides, acrylates, methacrylates, divinyl ethers, and the like.

The reference electrode 170 material may vary widely. Preferably the reference electrode 170 material is stable over the life of the battery, and exhibits a known reference voltage. In preferred embodiments, the reference electrode 170 material possesses a flat voltage profile, i.e., the voltage does not change substantially at different states of charge.

The reference electrode 170 material may include one or more lithium-containing materials. Exemplary lithium-containing reference electrode materials include, but are not limited to, lithium metal, $LiMO_2$ (M=Co, Ni, Mn, or combinations thereof); $LiM_2O_4$ (M=Mn, Ti, or combinations thereof); $LiMPO_4$ (M=Fe, Mn, Co, or combinations thereof); and $LiM_xM'_{2-x}O_4$ (M, M'=Mn or Ni). Lithium-containing reference electrode materials may include lithium alloys of metals such as Si, Al, and Sn. Other exemplary lithium-containing reference electrode materials include lithium-containing compounds of carbon materials such as graphite, coke, soft carbons, and hard carbons. In certain embodiments, the reference electrode 170 material is selected from the group consisting of metallic lithium, lithium titanium oxide, lithium iron phosphate, lithiated silicon, and combinations thereof.

Current collectors 110 and 180 collect electrical current generated and provide an efficient surface for attachment of electrical contacts leading to the external circuit. The current collectors 110 and 180 may be made from any suitable materials, such as (but not limited to) Al, Cu, Ni, C, Ti, Au, or Pt. The current collectors 110 and 180 may also be fabricated from alloys, such as stainless steel. Some embodiments employ conducting carbonaceous materials for current collectors 110 and 180. Current collectors 110 and 180 may be porous or non-porous, such as 5-50 µm thick metal foils.

Current collector 150 also collects electrical current generated and provides an efficient surface for attachment of electrical contacts leading to the external circuit. The current collector 150 is porous to allow ion communication through the cathode 140 (or another electrode, in other embodiments). A porous current collector allows lithium ions to be transported through the material, in the direction of ion flow. Preferred forms of porous current collectors 150 include, but are not limited to, mesh, foam, grids, nets, woven fibers, honeycombs, patterned or perforated holes on metal foil, metallized plastic films, expanded metal grids, metal wools, woven carbon fabrics, woven carbon meshes, non-woven carbon meshes, and carbon felts, and structured patterns such as micro-trusses. The pore size in porous current collectors 150 may vary, such as from about 1 nm to about 10 µm. Pores may be imparted into current collectors by etching or some other means. The holes may be round, square, or some other shape.

In some embodiments, one or more electrodes are free-standing and able to conduct electrons to or from an external circuit that is attached to the electrode. For such free-standing electrodes, a distinct current collector adjacent to the electrode is not necessary. For example, with reference to FIG. 1, current collector 110 and/or current collector 180 are not present in some embodiments employing a free-standing anode 120 and/or a free-standing reference electrode 170, respectively.

Some embodiments utilize a three-electrode battery as described in U.S. patent application Ser. No. 13/923,354, filed Jun. 20, 2013, for "BATTERY WITH REFERENCE ELECTRODE FOR VOLTAGE MONITORING" by Wang et al., now U.S. Pat. No. 9,379,418, issued Jun. 28, 2016, which is hereby incorporated by reference herein.

Separators can be fabricated from any suitable material. Examples include cellulosic materials (e.g., paper), non-woven fabrics (e.g., cellulose/rayon non-woven fabric), microporous resin films, and porous metal foils. The separator can be an insulating thin film that is high in ion permeability and that has a prescribed mechanical strength. As the material of the separator, an olefin polymer, a fluorine-containing polymer, a cellulose polymer, a polyimide, a nylon, glass fiber, or alumina fiber, in the form of a non-woven fabric, a woven fabric, or a microporous film, may be used.

Lithium-ion batteries include a liquid electrolyte to conduct lithium ions. The liquid electrolyte acts as a carrier between the cathode and the anode when the battery passes an electric current through an external circuit, and also between the lithium reference electrode and the cathode or anode in accordance with this invention. Liquid or gel electrolytes may be employed. The electrolyte may be aqueous or nonaqueous.

The electrolyte generally includes a solvent and a lithium salt (anion plus lithium cation). Examples of the solvent that can be used include aprotic organic solvents, such as propylene carbonate, ethylene carbonate, butylene carbonate, dimethyl carbonate, diethyl carbonate, methyl ethyl carbonate, γ-butyrolactone, methyl formate, methyl acetate, 1,2-dimethoxyethane, tetrahydrofuran, 2-methyltetrahydrofuran, dimethyl sulfoxide, 1,3-dioxolane, formamide, dimethylformamide, dioxolane, dioxane, acetonitrile, nitromethane, ethyl monoglyme, phosphoric triesters, trimethoxymethane, dioxolane derivatives, sulfolane, 3-methyl-2-oxazolidinone, propylene carbonate derivatives, tetrahydrofuran derivatives, ethyl ether, 1,3-propanesultone, N-methyl acetamide, acetonitrile, acetals, ketals, sulfones, sulfolanes, aliphatic ethers, cyclic ethers, glymes, polyethers, phosphate esters, siloxanes, dioxolanes, and N-alkylpyrrolidones. Ethylene carbonate and propylene carbonate are preferable. As is known in the art, other minor components and impurities can be present in the electrolyte composition.

Lithium salts include, but are not limited to, $LiClO_4$, $LiBF_4$, $LiPF_6$, $LiCF_3SO_3$, $LiCF_3CO_2$, $LiAsF_6$, $LiSbF_6$, $LiAlCl_4$, LiCl, LiBr, and LiI, which may be used alone or as a mixture of two or more. $LiBF_4$ and $LiPF_6$ are preferable, in some embodiments. The concentration of the salt is not particularly limited, but preferably is about 0.1 to 5 mol/L of the electrolytic solution.

The amount of electrolytes to be used in the battery may vary. Preferred amounts will depend on the amounts of the cathode and anode active material and the size of the battery.

The battery can be packaged into either prismatic format cells or cylindrical cells. In the prismatic format, the stacked structure is preferably sealed with a packaging material capable of preventing air and water contamination of the battery. Three terminals should be employed to allow electrical access to the battery—terminals for each of the cathode, the anode, and the lithium reference electrode.

In a cylindrical format, a multi-layered structure will be wound into a jelly roll. The lithium reference electrode layer can be placed in the outmost layer, or another layer. The jelly roll can be sealed in a metal container after battery electrolyte is added.

Generally, any of the multi-layered battery structures described herein may be repeated to increase the total capacity of the battery.

In some embodiments, the battery structure includes the reference electrode at one end of stacked layers. In some embodiments, the battery structure includes the reference electrode within stacked layers. The battery structure may be in a cylindrical or wounded prismatic configuration, with a reference electrode as an outer layer of the configuration, an inner layer of the configuration, or both. In certain embodiments, the battery structure further comprises at least one additional reference electrode which may be positioned such that it is not disposed spatially between the first electrode and the second electrode.

Lithium-ion batteries are typically included in a battery pack, which includes a plurality of electrochemical cells that are electrically connected in series and/or in parallel. Lithium-ion battery packs come in many shapes, sizes, capacities, and power ratings, depending on the intended use of the battery pack. Battery packs will typically include a number of lithium-ion cells and a thermal-management system. Open space or a heat-absorbing material may be incorporated between cells, to avoid excessive heating. Or, ceramic plates may be included between each cell, for example. A vent may be added to the battery box in case of thermal runaway reactions. In preferred embodiments utilizing this invention, the engineering overhead for thermal management is reduced by anode/cathode monitoring, thus increasing the effective system energy density.

Lithium-ion batteries according to this invention can be suitable for operating across a variety of temperature ranges. The temperature of lithium-ion battery operation can vary, as is known. Exemplary operation temperatures can be from −50° C. to 80° C., such as for military applications. For computers and related devices, as well as for electric-vehicle applications, an exemplary operation range is −30° C. to 60° C.

The scope of the invention, as mentioned above, is beyond lithium-ion batteries. In particular, the battery electrodes may be based on sodium (Na), potassium (K), or magnesium (Mg), for example. When alternative ions (other than Li) are employed, the reference electrode material should contain the alternative ions (e.g., $Na^+$, $K^+$, or $Mg^{2+}$).

Some variations provide an apparatus for characterizing a three-electrode metal-ion battery in real time, the apparatus comprising:

at least two voltage meters selected from first, second, and third voltage meters, wherein the first voltage meter is connectable between a first electrode and a second electrode of a selected battery, the second voltage meter is connectable between the first electrode and a reference electrode of the battery, and the third voltage meter is connectable between the second electrode and the reference electrode;

a computer programmed using non-transitory memory with executable code for executing the steps of:

(a) controlling a current source to drive the battery with a current cycling profile;

(b) measuring current signals between the first and second electrodes, and at least two voltage signals derived from the first, second, and/or third voltage meters; and (c) calculating an impulse response of each of the first and second electrodes, from the current signals and the voltage signals, to dynamically estimate open-circuit potential and impedance of each of the first and second electrodes.

The apparatus may be linked in operable communication with a battery, wherein at least two of the two voltage meters are connected between electrodes. Each of the first, second, and third voltage meters is present in the apparatus, and connected between applicable electrodes, in certain embodiments. The battery may be, but is by no means limited to, a lithium-ion battery.

In some embodiments of the apparatus, the impulse response in step (c) is calculated using a recursive technique, such as a recursive technique comprising constructing an executable mathematical model of the system operable to estimate the impulse response, the mathematical model comprising an equation summing a plurality of sensed data signals including measured current passing the system at a time-certain, and measured voltage of each of the electrodes; updating the impulse response via a recursive least-squares equation based on the sensed data signals at the time-certain, and results determined at a preceding time-certain; and calculating the Fourier transform of the impulse response to obtain an impedance spectrum for each of the electrodes.

In some embodiments of the apparatus, the impulse response in step (c) is calculated using a matrix-based technique, such as a matrix-based technique comprising the substeps of:

(i) initializing a state vector, including open-circuit voltage and impulse response of a selected electrode with a finite time sequence;

(ii) initializing the covariance matrix with a square matrix;

(iii) sensing current and voltage signals of the selected electrode;

(iv) constructing input vectors with current signals in the time sequence;

(v) constructing output vectors with voltage signals in the time sequence;

(vi) computing a signal difference by subtracting the inner product of the state vector and the input vector from the output vector;

(vii) updating the covariance matrix;

(viii) calculating a gain vector by transforming the input vector with the updated covariance matrix;

(ix) updating the state vector and reading out the open-circuit voltage from the first element of the state vector; and (x) updating the open-circuit voltage by repeating steps (iii)-(ix) in a next time step.

In order for the model to be robust against noises and be agile enough for real-time use, an algorithm is employed that calculates or estimates an impulse response. In the algorithm, the impulse response of the system is deduced with the current and voltage samples of a battery in a selected time window. A moving-window technique may be employed to update the algorithm recursively. The sizes of the impulse response and the window can be adjusted to accommodate the bandwidth of the kinetic process of the system. Once the impulse response is deduced at real time, states of the electrochemical system can be derived based on the impulse repulse.

In some embodiments, the algorithm implements noise-filtering techniques which enable stable regression in the algorithm in the presence of noise (e.g., due to electromagnetic interference). Such noise reduction methods also improve the accuracy and reliability of the regressed parameters. Various types of noise in the current and/or voltage data may be present, including high-frequency noise.

In some embodiments, a high-frequency pass filter is used for filtering out static noises associated with current and voltage measurements. A high-frequency pass filter is an electronic filter that passes high-frequency signals but attenuates signals with frequencies lower than the cutoff frequency. High-frequency pass filtering to remove at least some static noises may be helpful in improving the stability of the algorithm.

In some embodiments, a least-squares regression method is implemented for improving the stability of the algorithm against high-frequency noises. Least-squares regression utilizes methods such as, but not limited to, linear least squares, non-linear least squares, partial least squares, sparse partial least squares, weighted least squares, least squares with penalty function, and combinations thereof.

The linear least-squares fitting technique is a convenient form of linear regression. For non-linear least squares fitting to a number of unknown parameters, linear least squares fitting may be applied iteratively to a linearized form of the function until convergence is achieved. It is also possible to linearize a non-linear function at the outset and still use linear methods for determining fit parameters. If uncertainties are known or estimated, points can be weighted differently in order to give the high-quality points more weight, if desired.

In certain embodiments, additional data inputs (beyond current and voltage) are considered in the model and algorithms. Additional data inputs may relate to ambient conditions of the local environment, including temperature, relative humidity, and electromagnetic interference patterns, for instance. Additional data inputs may be based on previous experience with similar devices, or other ways to capture prior knowledge to improve the accuracy of the diagnostics for the intended purpose. These additional data inputs may be quantitative or qualitative in nature.

In FIG. 3, first data inputs form the current (I in the figure) time sequence, second data inputs form the voltage (V in the figure) time sequence, third data inputs are the differential current data (dI in the figure), fourth data inputs are the differential voltage data (dV in the figure), and the equation [DV]=[DI][H] is solved in the computer to calculate an impulse response H(t) from the first, second, third, and fourth data inputs using matrix-based calculations (lower-left part of FIG. 3) or recursive calculations (lower-right part of FIG. 3), or optionally some combination thereof.

The "computer" utilized in the apparatus is any programmable computing device, or plurality of devices which may be distributed in time or space, capable of being programmed (such as using C++ programming language) or otherwise caused to execute code for executing the steps of any of the methods or algorithms described herein. The algorithm may be embedded within a controller.

In some embodiments, the computer has a processor, an area of main memory for executing program code under the direction of the processor, a storage device for storing data and program code and a bus connecting the processor, main memory, and the storage device; the code being stored in the storage device and executing in the main non-transient memory under the direction of the processor, to perform the steps of the methods or algorithms recited in this description. Optionally, the computer may be configured to exchange data with a network (such as the Internet), and may carry out calculations on remote computers, servers, or via cloud computing.

Figure 4:
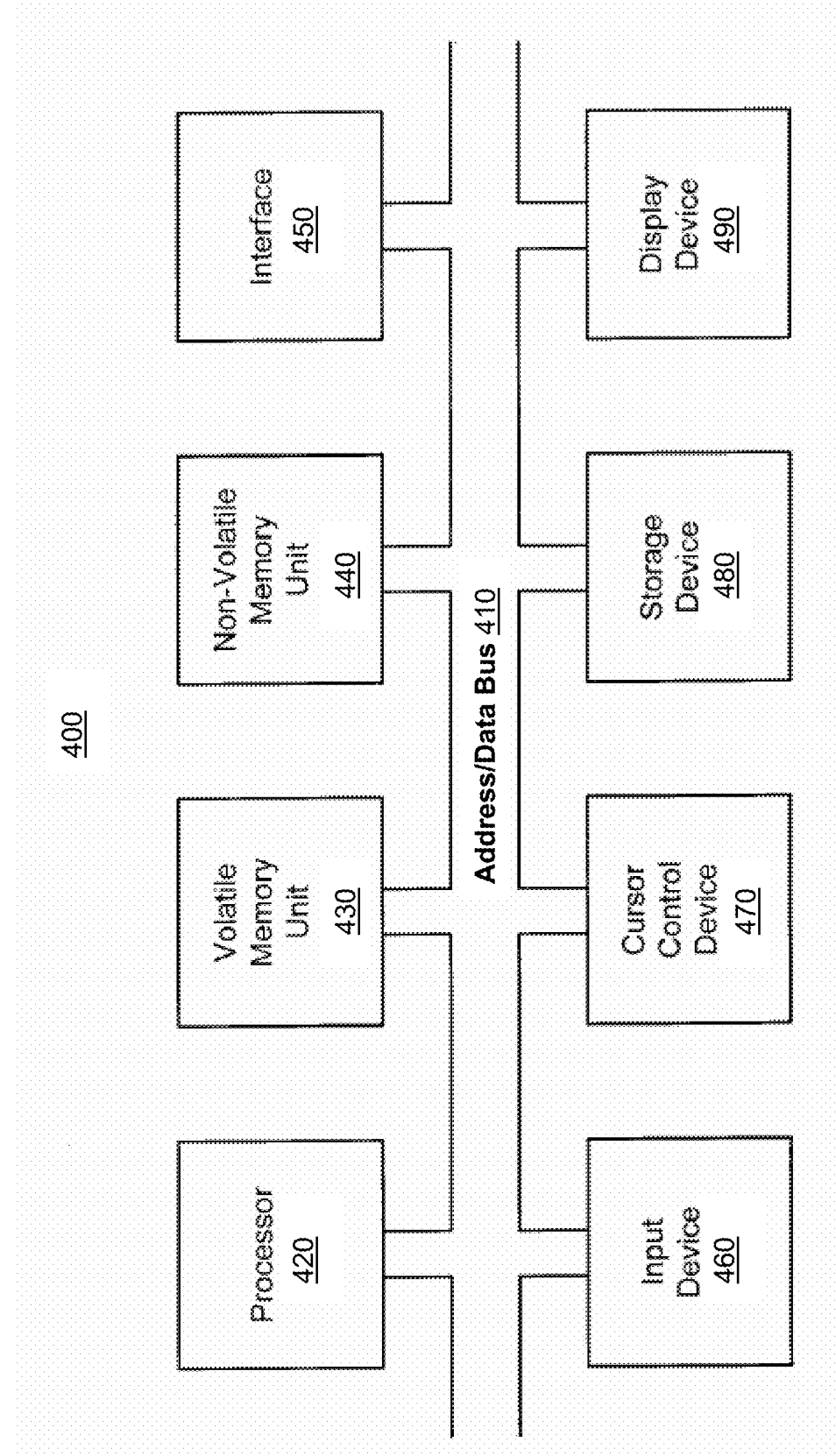
FIG. 4 is a simplified schematic of an exemplary computer system that may be utilized in variations of the invention.

An exemplary computer system 400 in accordance with some embodiments is shown in FIG. 4. Exemplary computer system 400 is configured to perform calculations, processes, operations, and/or functions associated with a program or algorithm. In some embodiments, certain processes and steps discussed herein are realized as a series of instructions (e.g., software program) that reside within computer-readable memory units and are executed by one or more processors of exemplary computer system 400. When executed, the instructions cause exemplary computer system 400 to perform specific actions and exhibit specific behavior, such as described herein.

Exemplary computer system 400 may include an address/data bus 410 that is configured to communicate information. Additionally, one or more data processing units, such as processor 420, are coupled with address/data bus 410. Processor 420 is configured to process information and instructions. In some embodiments, processor 420 is a microprocessor. Alternatively, processor 420 may be a different type of processor such as a parallel processor, or a field-programmable gate array.

Exemplary computer system 400 is configured to utilize one or more data-storage units. Exemplary computer system 400 may include a volatile memory unit 430, such as (but not limited to) random access memory ("RAM"), static RAM, or dynamic RAM, etc.) coupled with address/data bus 410, wherein volatile memory unit 430 is configured to store information and instructions for processor 420. Exemplary computer system 400 further may include a non-volatile memory unit 440, such as (but not limited to) read-only memory ("ROM"), programmable ROM ("PROM"), erasable programmable ROM ("EPROM"), electrically erasable programmable ROM "EEPROM"), or flash memory coupled with address/data bus 410, wherein non-volatile memory unit 440 is configured to store static information and instructions for processor 420. Alternatively exemplary computer system 400 may execute instructions retrieved from an online data-storage unit such as in "cloud computing."

In some embodiments, exemplary computer system 400 also may include one or more interfaces, such as interface 450, coupled with address/data bus 410. The one or more interfaces are configured to enable exemplary computer system 400 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In some embodiments, exemplar computer system 400 may include an input device 460 coupled with address/data bus 410, wherein input device 460 is configured to communicate information and command selections to processor 420. In accordance with certain embodiments, input device 460 is an alphanumeric input device, such as a keyboard, that may include alphanumeric and/or function keys. Alternatively, input device 460 may be an input device other than an alphanumeric input device. In some embodiments, exemplar computer system 400 may include a cursor control device 470 coupled with address/data bus 410, wherein cursor control device 470 is configured to communicate user input information and/or command selections to processor 420. A cursor control device 470 may be implemented using a device such as a mouse, a track-ball, a track-pad, an optical tracking device, or a touch screen. A cursor control device 470 may alternatively, or additionally, be directed and/or activated via input from input device 460, such as in response to the use of special keys and key sequence commands associated with input device 460. Alternatively, or additionally, cursor control device 470 may be configured to be directed or guided by voice commands.

In some embodiments, exemplary computer system 400 further may include one or more optional computer-usable data-storage devices, such as storage device 480, coupled with address/data bus 410. Storage device 480 is configured to store information and/or computer-executable instructions. In some embodiments, storage device 480 is a storage device such as a magnetic or optical disk drive, including for example a hard disk drive ("HDD"), floppy diskette, compact disk read-only memory ("CD-ROM"), or digital versatile disk ("DVD"). In some embodiments, a display device 490 is coupled with address/data bus 410, wherein display device 490 is configured to display video and/or graphics. Display device 490 may include a cathode ray tube ("CRT"), liquid crystal display ("LCD"), field emission display ("FED"), plasma display or any other display device suitable for displaying video and/or graphic images and alphanumeric characters recognizable to a user.

Exemplary computer system 400 is presented herein as an exemplary computing environment in accordance with some embodiments. However, exemplary computer system 400 is not strictly limited to being a computer system. For example, exemplary computer system 400 may represent a type of data processing analysis that may be used in accordance with various embodiments described herein. Moreover, other computing systems may also be implemented. Indeed, the spirit and scope of the present technology is not limited to any single data processing environment. Thus, in some embodiments, one or more operations of various embodiments are controlled or implemented using computer-executable instructions, such as program modules, being executed by a computer. Such program modules may include routines, programs, objects, components and/or data structures that are configured to perform particular tasks or implement particular abstract data types. In addition, in some embodiments, one or more aspects are implemented by utilizing distributed computing environments, such as where tasks are performed by remote processing devices that are linked through a communications network, or such as where various program modules are located in both local and remote computer-storage media including memory-storage devices.

EXAMPLES

To demonstrate some embodiments of the invention, a Li-ion three-electrode pouch cell is employed in Examples 1 to 4. The cell adapts a porous current-collector design (see FIG. 1) that is readily implemented in commercial cells without major modifications of the battery cell design.

Example 1: Li-Ion Three-Electrode Cell—Data Acquisition

Figure 5:
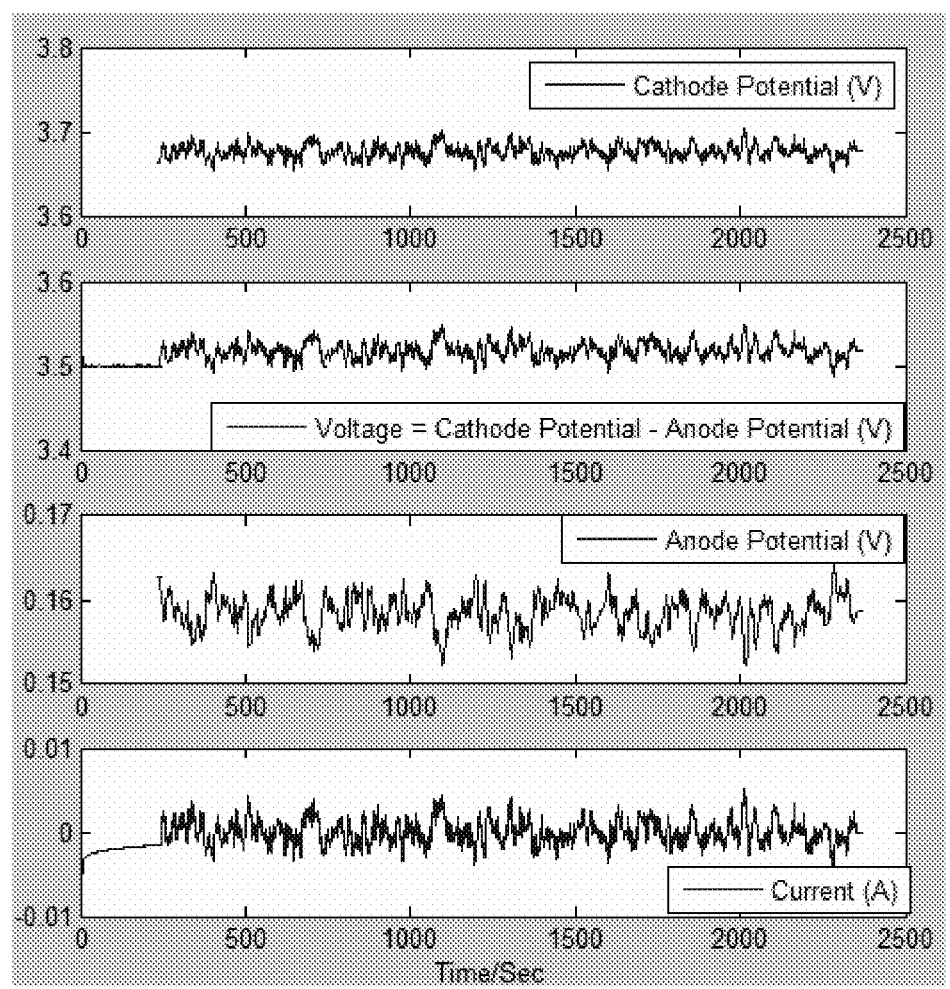
FIG. 5 is a plot of experimental current and voltage data, in Example 1.

An Arbin 11 cell (Arbin Instruments, College Station, Tex., US) is used to drive a three-electrode Li-ion pouch cell. The current signals recorded in the bottom row of FIG. 5 are used to drive the cell. The voltage signals (V) between two electrodes are measured by the Arbin 11 cell, as shown in the second row of FIG. 5. The potential difference between cathode and the Li reference electrode, $V_{cathode}$, is measured with a digital multi-meter (DMM, AGILENT 34401A), and shown in the first row of FIG. 5. The anode potential, $V_{anode}$, is measured with a potentiostat in Solotron 1287A and shown in the third row of FIG. 5.

Example 2: Li-Ion Three-Electrode Cell—Real-Time Regression of Anode Kinetics and Thermodynamic Potentials Equation 8 gives the anode potential as the sum of the thermodynamic potential and kinetic potential. Based on the impulse-response algorithm in time domain, we can regress the impulse response function of the anode $H_a(t)$ as well as the anode thermodynamic potential (or open-circuit potential) in real time.

Figure 6A:
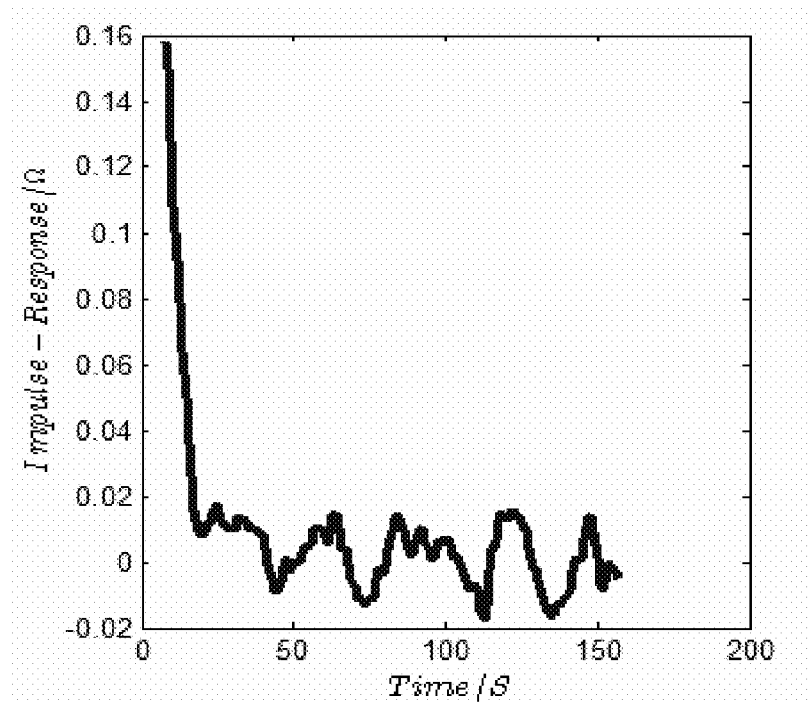
FIG. 6A is a plot of the impulse response H(t), in Example 2.
Figure 6B:
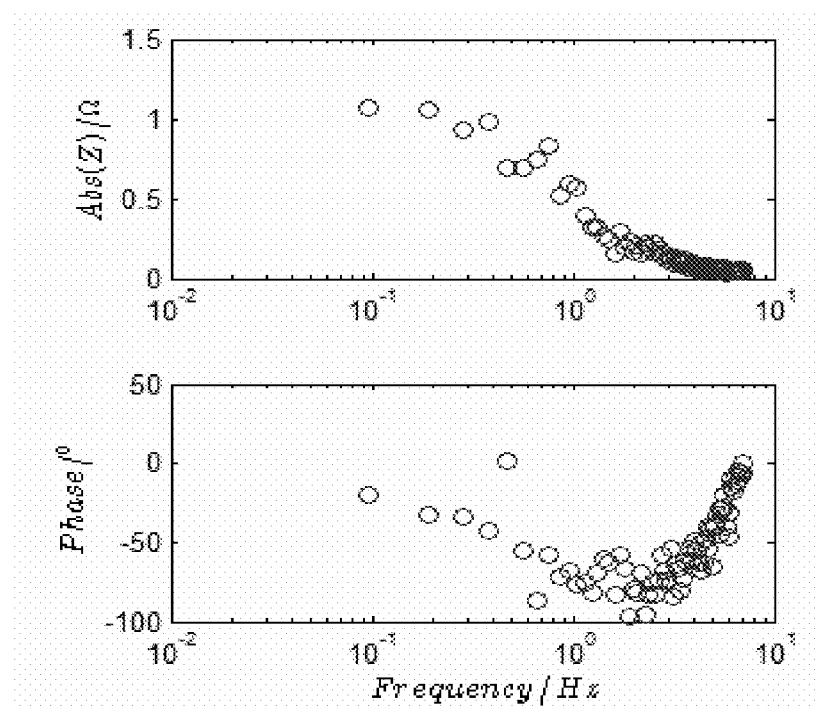
FIG. 6B is a plot of the magnitude of H(z) (top graph) and the phase of H(z) (bottom graph), in Example 2.
Figure 6C:
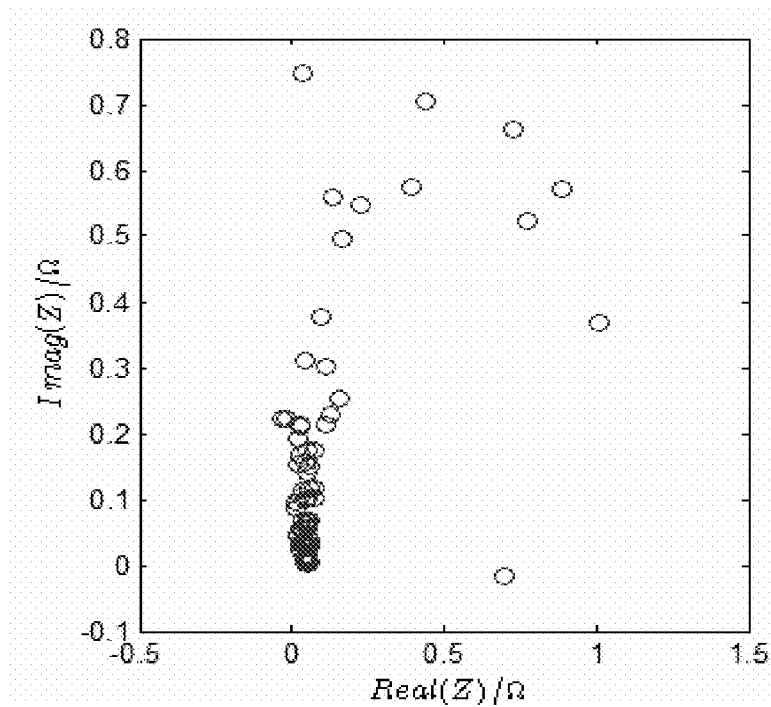
FIG. 6C is a Nyquist plot for the H(z) function, in Example 2.

FIGS. 6A, 6B, and 6C provide the snapshot of the impulse response function during the battery cycling. The frequency transform of $H_a(t)$ manifests the anode impedance. FIG. 6A shows the impulse response H(t). FIG. 6B shows the magnitude of H(z) (top graph) and the phase of H(z) (bottom graph). FIG. 6C shows the Nyquist plot for the H(z) function. The Nyquist plot is the Fourier transform of H(t), where the real part of impedance Z is plotted on the x-axis and the imaginary part of Z is plotted on the y-axis. The high-frequency resistance of the anode is smaller than 0.1 ohm. The total anode resistance range is between 0 to about 1 ohm.

Figure 7:
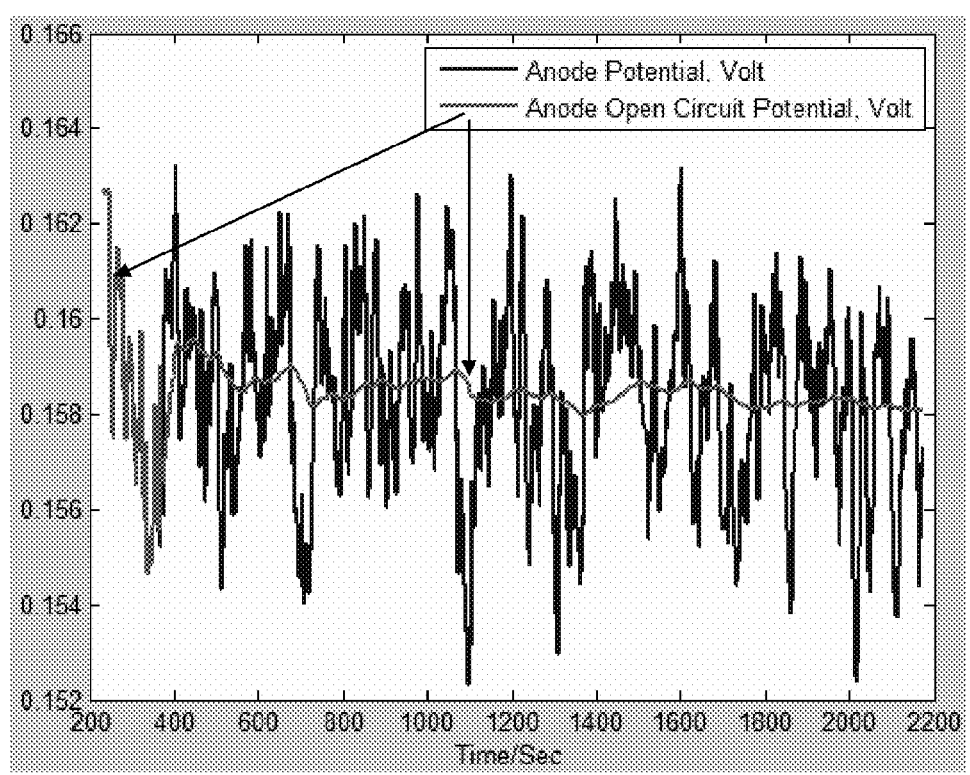
FIG. 7 is a plot of experimental anode potential data and the anode's thermodynamic (open-circuit) potential regressed according to Example 2.

The anode's thermodynamic (open-circuit) potential is regressed and plotted together with the anode potential, as shown in FIG. 7. Except at the beginning period up to 300 seconds, the anode's open-circuit potential is in the range of about 0.158 to 0.16 volts.

Example 3: Li-Ion Three-Electrode Cell—Real-Time Regression of Cathode Kinetics and Thermodynamic Potentials Equation 9 gives the cathode potential as the sum of its thermodynamic potential and its kinetic potential. Based on the impulse response algorithm in the time domain, we can regress the impulse response function of the anode $H_c(t)$ as well as the cathode thermodynamic potential (or open-circuit potential) in real time.

Figure 8A:
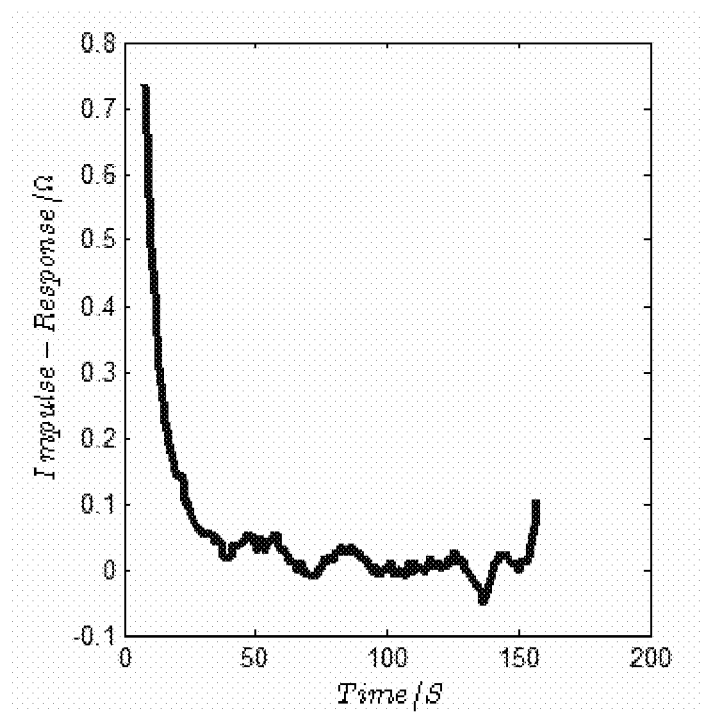
FIG. 8A is a plot of the impulse response H(t), in Example 3.
Figure 8B:
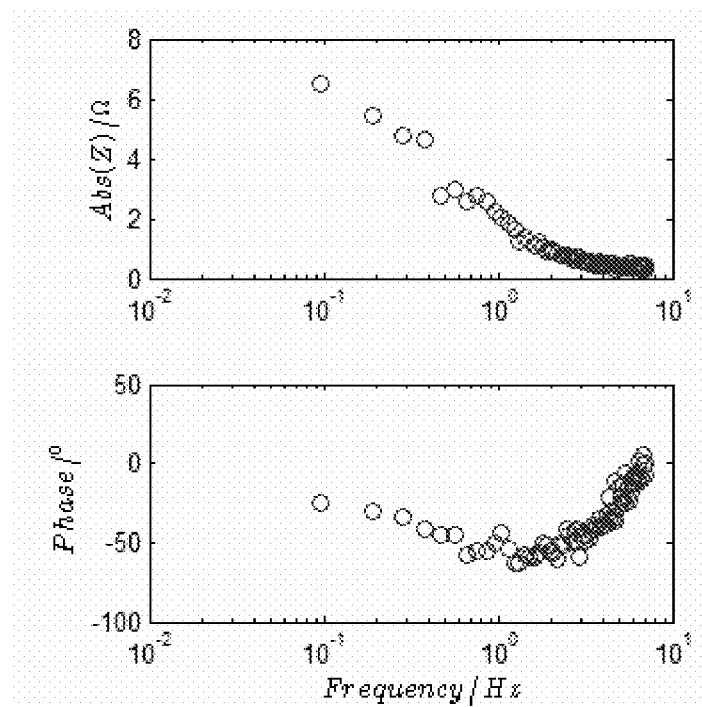
FIG. 8B is a plot of the magnitude of H(z) (top graph) and the phase of H(z) (bottom graph), in Example 3.
Figure 8C:
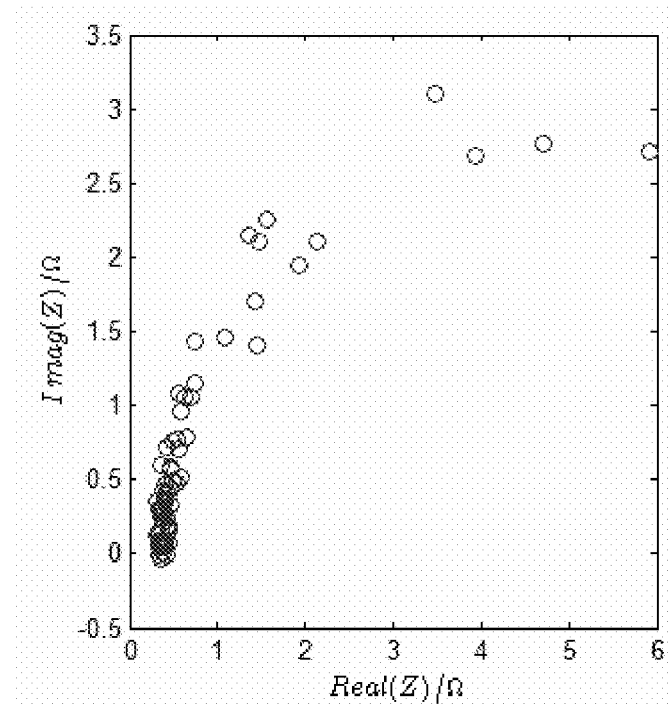
FIG. 8C is a Nyquist plot for the H(z) function, in Example 4.
Figure 9:
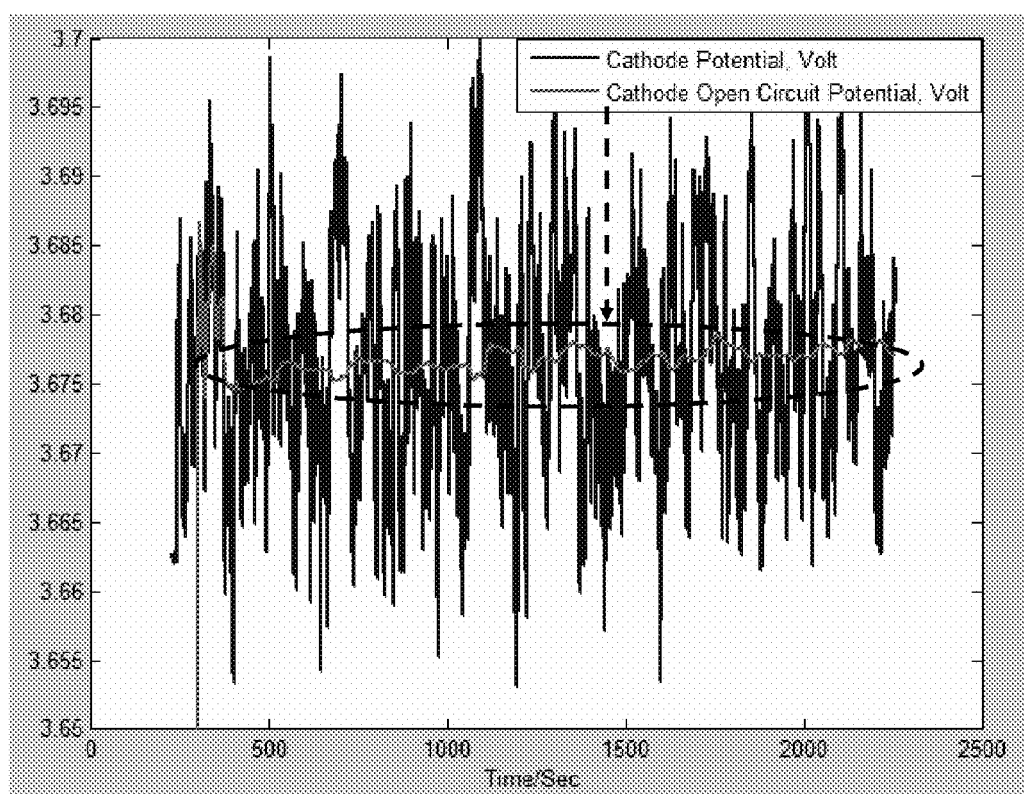
FIG. 9 is a plot of experimental cathode potential data and the anode's thermodynamic (open-circuit) potential regressed according to Example 3.

FIGS. 8A, 8B, and 8C provide the snapshot of the impulse response function during the battery cycling. The frequency transform of $H_c(t)$ manifests the cathode impedance. FIG. 8A shows the impulse response H(t). FIG. 8B shows the magnitude of H(z) (top graph) and the phase of H(z) (bottom graph). FIG. 8C shows the Nyquist plot for the H(z) function. The high-frequency resistance of the cathode is around 0.5 ohm. The total cathode resistance range is larger than 0.5 ohm and extends beyond 6 ohm. The cathode's thermodynamic potential is regressed and plotted together with the cathode potential, as shown in FIG. 9. Except at the beginning period up to 300 seconds, the cathode's open-circuit potential is in the range of about 3.67 to 3.68 volts (data marked with a dotted circle).

Example 4: Li-Ion Three-Electrode Cell—Verification by Real-Time Regression of Cell Kinetics and Thermodynamic Potentials Equation 10 gives the cell's potential as the sum of its thermodynamic potential and its kinetic potential. Based on the impulse response algorithm in time domain, we can regress the impulse response function of the total impulse response $H_R(t)$ as well as the cell's thermodynamic potential (open-circuit potential) in real time.

Figure 10A:
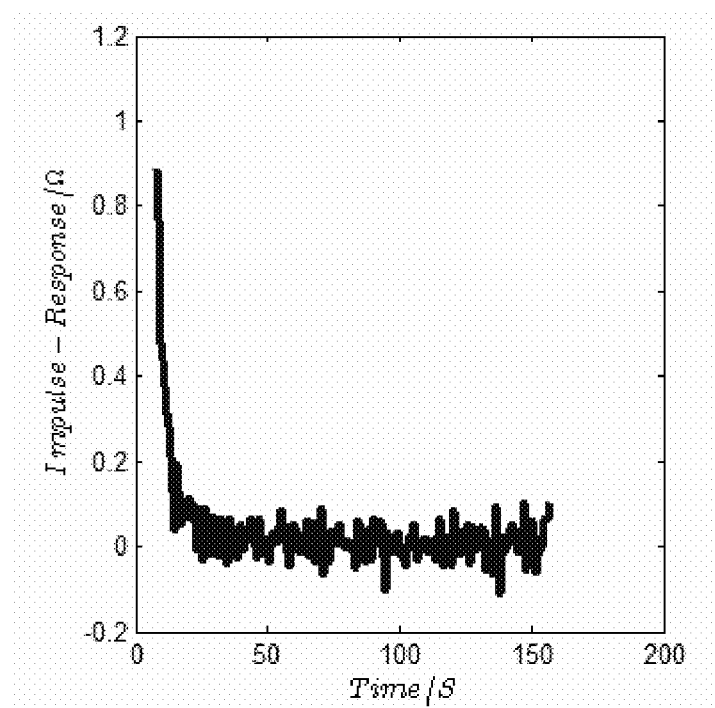
FIG. 10A is a plot of the impulse response H(t), in Example 4.
Figure 10B:
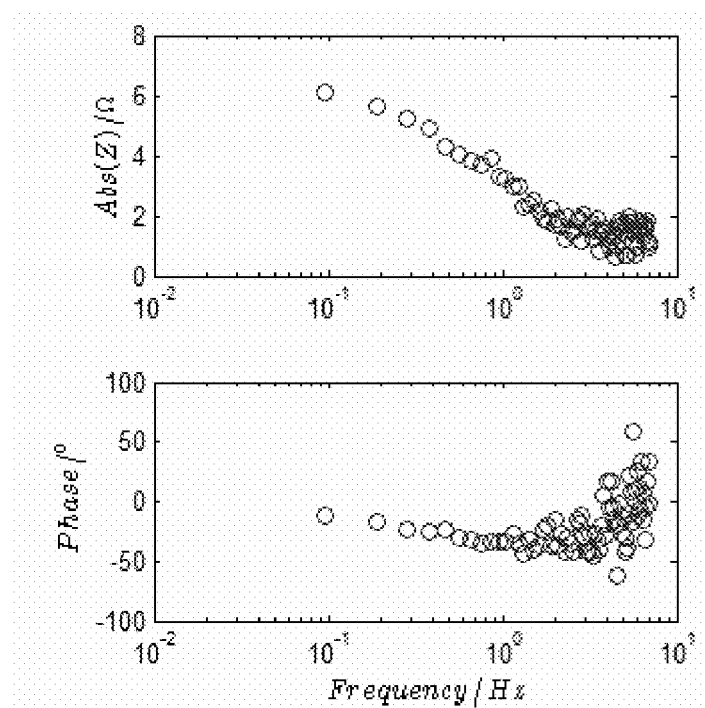
FIG. 10B is a plot of the magnitude of H(z) (top graph) and the phase of H(z) (bottom graph), in Example 3.
Figure 10C:
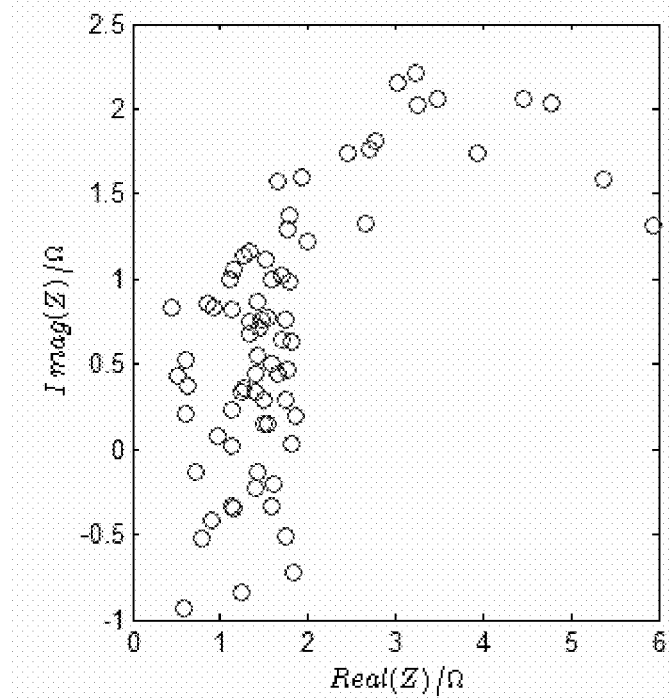
FIG. 10C is a Nyquist plot for the H(z) function, in Example 4.

FIGS. 10A, 10B, and 10C provide the snapshot of the impulse response function during the battery cycling. The frequency transform of $H_R(t)$ manifests the cell's impedance. FIG. 10A shows the impulse response H(t). FIG. 10B shows the magnitude of H(z) (top graph) and the phase of H(z) (bottom graph). FIG. 10C shows the Nyquist plot for the H(z) function.

Figure 11:
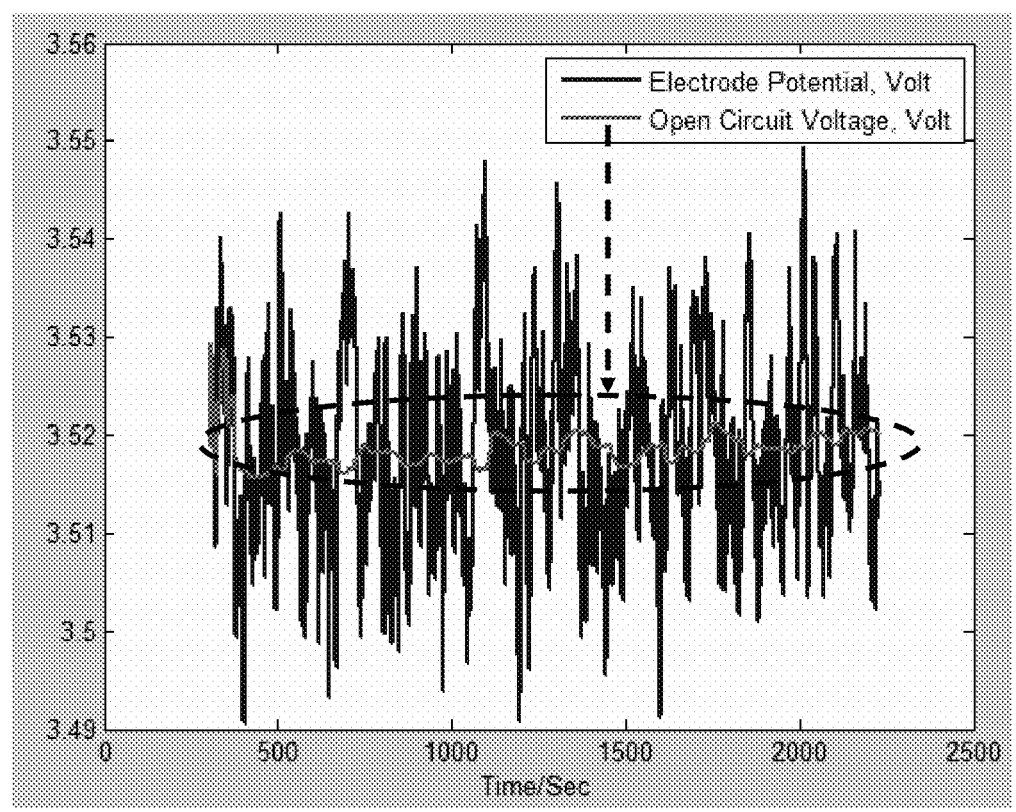
FIG. 11 is a plot of experimental cell potential data and the cell's thermodynamic (open-circuit) potential regressed according to Example 4.
Figure 12:
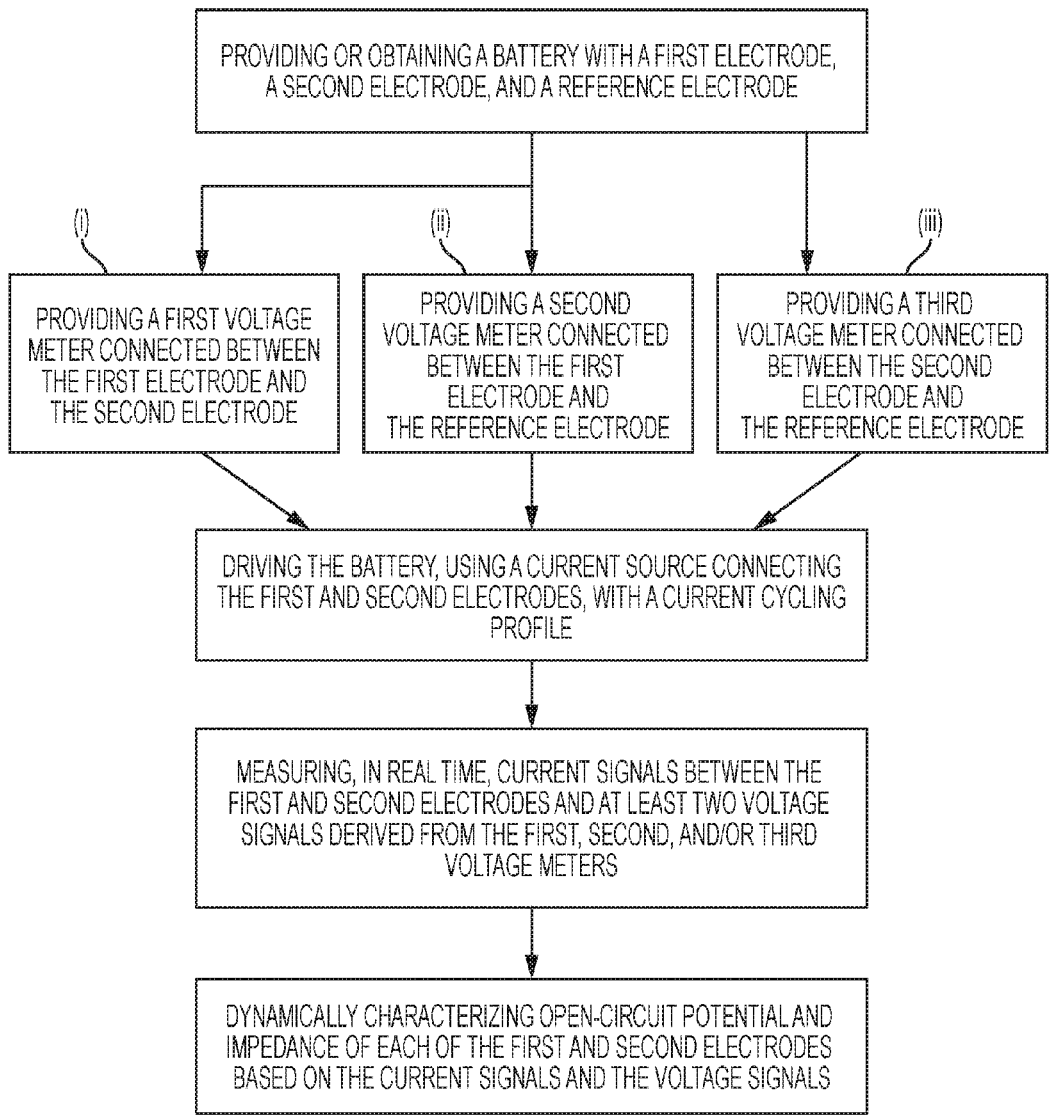
FIG. 12 is an illustration of the method of the invention to dynamically characterize the open-circuit potential and impedance of each first and second electrodes of a metal-ion battery in real time, in some embodiments, noting that at least two out of three of the substeps (i), (ii), and (iii) are necessary.

The cell's thermodynamic potential is regressed and plotted together with the cell potential, as shown in FIG. 11. Except at the beginning period up to 300 seconds, the cell's open-circuit potential is in the range of about 3.51 to 3.52 volts. By comparing the three open-circuit potentials, we can deduce that the average cathode open-circuit potential is the sum of the anode open-circuit potential and the cell open-circuit potential, which is consistent.

The high-frequency resistance of the anode is around 0.5 ohm (Example 2). The total cathode resistance range is larger than 0.5 ohm and extends beyond 6 ohm (Example 3). By comparing the cell's impedance (FIG. 10A), the anode impedance (FIG. 6A), and the cathode impedance (FIG. 8A), we verify that the values of cell impedance are close to the sum of the anode and cathode impedance. Moreover, for this kind of cell, the impedance is expected to be cathode-dominated, as observed.

In summary, the circuit connection and the associated on-line regression method enables characterization of a three-electrode battery, including each electrode's kinetics and thermodynamic open-circuit potential. In Examples 1-4, the cell is driven with a random current profile. The current and each electrode's voltage against the reference electrode are measured, as well as the potential difference between two electrodes. The equations governing each electrode's voltage response to its current input, provided in this specification, are applied to recursively regress in real-time. The characterization technique is justified by demonstrating that the cell's impedance is close to the sum of the impedance from each electrode, and that the cell's open-circuit potential is the difference between the cathode's open-circuit potential and the anode's open-circuit potential. This experiment therefore demonstrates real-time characterization of a three-electrode battery.

There are a wide variety of practical and commercial uses for the present invention. Applications of the algorithms in diagnosing battery systems include, but are not limited to, battery diagnostics for in-flight batteries on satellites, aircraft, or other aviation vehicles; real-time management of traction batteries for electric vehicles or hybrid-electric vehicles; and battery-pack management for soldier power and ground vehicles.

This invention will benefit commercial applications where battery safety, battery health and battery life information are important. Especially for automobiles and airplanes, knowledge of battery health/life information as well as battery safety is critical to meet customer satisfaction. Direct measurements of the battery electrode potentials can greatly improve the battery safety and enhance the accuracy and reliability of battery management.

The current invention may also impact other commercial military and space applications such as consumer portable electronics, electric bikes, power tools, aircrafts, and satellites that can benefit from better health/life monitoring at a reduced costs. Generally, practical applications for this invention include, but are not limited to, laptop computers, mobile phones, cameras, medical devices, electric vehicles, electric bikes, scooters, and power tools.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method of characterizing a metal-ion battery in real time, said method comprising:
   (a) providing or obtaining a battery with a first electrode, a second electrode, and a reference electrode;
   (b) conducting at least two of the following substeps: (b)(i) providing a first voltage meter connected between said first electrode and said second electrode; (b)(ii) providing a second voltage meter connected between said first electrode and said reference electrode; and/or (b)(iii) providing a third voltage meter connected between said second electrode and said reference electrode;
   (c) driving said battery, using a current source connecting said first and second electrodes, with a current cycling profile;
   (d) measuring, in real time, current signals between said first and second electrodes and at least two voltage signals derived from said first, second, and/or third voltage meters in substeps (b)(i), (b)(ii), and/or (b)(iii), respectively; and
   (e) dynamically characterizing open-circuit potential and impedance of each of said first and second electrodes based on said current signals and said voltage signals.

2. The method of claim 1, wherein said metal-ion battery is a lithium-ion battery.

3. The method of claim 1, wherein all of substeps (b)(i), (b)(ii), and (b)(iii) are conducted.

4. The method of claim 3, said method comprising repositioning one of said voltage meters for use as another one of said voltage meters.

5. The method of claim 1, wherein said impulse response in step (e) is calculated using a recursive technique.

6. The method of claim 5, where said recursive technique comprises constructing an executable mathematical model of said system operable to estimate said impulse response, said mathematical model comprising an equation summing a plurality of sensed data signals including measured current passing said system at a time-certain, and measured voltage of each of said electrodes; updating said impulse response via a recursive least-squares equation based on said sensed data signals at said time-certain, and results determined at a preceding time-certain; and calculating the Fourier transform of said impulse response to obtain an impedance spectrum for each of said electrodes.

7. The method of claim 1, wherein said impulse response in step (e) is calculated using a matrix-based technique.

8. The method of claim 7, wherein said matrix-based technique comprises the substeps of:
(e)(i) initializing a state vector, including open-circuit voltage and impulse response of a selected electrode with a finite time sequence;
(e)(ii) initializing the covariance matrix with a square matrix;
(e)(iii) sensing current and voltage signals of said selected electrode;
(e)(iv) constructing input vectors with current signals in said time sequence;
(e)(v) constructing output vectors with voltage signals in said time sequence;
(e)(vi) computing a signal difference by subtracting the inner product of said state vector and said input vector from said output vector;
(e)(vii) updating said covariance matrix;
(e)(viii) calculating a gain vector by transforming said input vector with said updated covariance matrix;
(e)(ix) updating said state vector and reading out said open-circuit voltage from the first element of said state vector; and
(e)(x) updating said open-circuit voltage by repeating steps (iii)-(ix) in a next time step.

9. A battery system comprising a three-electrode metal-ion battery configured with at least two voltage meters selected from a first voltage meter connected between a first electrode and a second electrode, a second voltage meter connected between said first electrode and a reference electrode, and/or a third voltage meter connected between said second electrode and said reference electrode; a current source connecting said first and second electrodes; and a computer disposed in communication with said battery, said computer programmed using non-transitory memory with executable code for executing the steps of:
(a) controlling said current source to drive said battery with a current cycling profile;
(b) measuring current signals between said first and second electrodes, and at least two voltage signals derived from said first, second, and/or third voltage meters; and
(c) calculating an impulse response of each of said first and second electrodes, from said current signals and said voltage signals, to dynamically estimate open-circuit potential and impedance of each of said first and second electrodes.

10. The battery system of claim 9, wherein said metal-ion battery is a lithium-ion battery.

11. The battery system of claim 9, wherein each of said first, second, and third voltage meters is present in said battery system.

12. The battery system of claim 9, wherein said impulse response in step (c) is calculated using a recursive technique.

13. The battery system of claim 12, where said recursive technique comprises constructing an executable mathematical model of said system operable to estimate said impulse response, said mathematical model comprising an equation summing a plurality of sensed data signals including measured current passing said system at a time-certain, and measured voltage of each of said electrodes; updating said impulse response via a recursive least-squares equation based on said sensed data signals at said time-certain, and results determined at a preceding time-certain; and calculating the Fourier transform of said impulse response to obtain an impedance spectrum for each of said electrodes.

14. The battery system of claim 9, wherein said impulse response in step (c) is calculated using a matrix-based technique.

15. The battery system of claim 14, wherein said matrix-based technique comprises the substeps of:
(i) initializing a state vector, including open-circuit voltage and impulse response of a selected electrode with a finite time sequence;
(ii) initializing the covariance matrix with a square matrix;
(iii) sensing current and voltage signals of said selected electrode;
(iv) constructing input vectors with current signals in said time sequence;
(v) constructing output vectors with voltage signals in said time sequence;
(vi) computing a signal difference by subtracting the inner product of said state vector and said input vector from said output vector;
(vii) updating said covariance matrix;
(viii) calculating a gain vector by transforming said input vector with said updated covariance matrix;
(ix) updating said state vector and reading out said open-circuit voltage from the first element of said state vector; and
(x) updating said open-circuit voltage by repeating steps (iii)-(ix) in a next time step.

16. The battery system of claim 9, wherein said reference electrode is not spatially between said first and second electrodes.

17. The battery system of claim 16, wherein said first electrode is disposed adjacent to a first current collector, wherein said first electrode supplies or accepts selected battery metal ions; said second electrode, with polarity opposite of said first electrode, is disposed adjacent to a second current collector, wherein said second electrode supplies or accepts said metal ions, and wherein said second current collector is porous and permeable to said metal ions; said reference electrode is disposed adjacent to a third current collector, wherein said reference electrode contains said metal ions; wherein a first separator is interposed between said first electrode and said second electrode, to electronically isolate said first electrode from said second electrode; and wherein a second separator is interposed between said second current collector and said reference electrode, to electronically isolate said second electrode from said reference electrode.

18. An apparatus for characterizing a three-electrode metal-ion battery in real time, said apparatus comprising:

at least two voltage meters selected from first, second, and third voltage meters, wherein said first voltage meter is connectable between a first electrode and a second electrode of a selected battery, said second voltage meter is connectable between said first electrode and a reference electrode of said battery, and said third voltage meter is connectable between said second electrode and said reference electrode;

a computer programmed using non-transitory memory with executable code for executing the steps of:

(a) controlling a current source to drive said battery with a current cycling profile;

(b) measuring current signals between said first and second electrodes, and at least two voltage signals derived from said first, second, and/or third voltage meters; and (c) calculating an impulse response of each of said first and second electrodes, from said current signals and said voltage signals, to dynamically estimate open-circuit potential and impedance of each of said first and second electrodes.

19. The apparatus of claim 18, wherein each of said first, second, and third voltage meters is present in said apparatus.

20. The apparatus of claim 18, wherein said apparatus is linked in operable communication with said battery, and wherein at least two of said two voltage meters are connected between electrodes.

21. The apparatus of claim 20, wherein said battery is a lithium-ion battery.

22. The apparatus of claim 18, wherein said impulse response in step (c) is calculated using a recursive technique.

23. The apparatus of claim 22, where said recursive technique comprises constructing an executable mathematical model of said system operable to estimate said impulse response, said mathematical model comprising an equation summing a plurality of sensed data signals including measured current passing said system at a time-certain, and measured voltage of each of said electrodes; updating said impulse response via a recursive least-squares equation based on said sensed data signals at said time-certain, and results determined at a preceding time-certain; and calculating the Fourier transform of said impulse response to obtain an impedance spectrum for each of said electrodes.

24. The apparatus of claim 18, wherein said impulse response in step (c) is calculated using a matrix-based technique.

25. The apparatus of claim 24, wherein said matrix-based technique comprises the substeps of:

(i) initializing a state vector, including open-circuit voltage and impulse response of a selected electrode with a finite time sequence;

(ii) initializing the covariance matrix with a square matrix;

(iii) sensing current and voltage signals of said selected electrode;

(iv) constructing input vectors with current signals in said time sequence;

(v) constructing output vectors with voltage signals in said time sequence;

(vi) computing a signal difference by subtracting the inner product of said state vector and said input vector from said output vector;

(vii) updating said covariance matrix;

(viii) calculating a gain vector by transforming said input vector with said updated covariance matrix;

(ix) updating said state vector and reading out said open-circuit voltage from the first element of said state vector; and (x) updating said open-circuit voltage by repeating steps (iii)-(ix) in a next time step.

* * * * *